(12) United States Patent
Akimoto

(10) Patent No.: US 7,702,009 B2
(45) Date of Patent: Apr. 20, 2010

(54) TIMING ANALYSIS APPARATUS AND METHOD OF TIMING ANALYSIS

(75) Inventor: Tetsuya Akimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 692 days.

(21) Appl. No.: 11/639,291

(22) Filed: Dec. 15, 2006

(65) Prior Publication Data

US 2007/0150218 A1   Jun. 28, 2007

(30) Foreign Application Priority Data

Dec. 27, 2005   (JP) .............................. 2005-373850

(51) Int. Cl.
H04Q 1/20   (2006.01)
(52) U.S. Cl. .................................... 375/226
(58) Field of Classification Search ................ 375/226; 370/516; 702/69; 348/497
See application file for complete search history.

(56) References Cited

U.S. PATENT DOCUMENTS 7,454,301 B1 * 11/2008 Daud et al. .................... 702/69
2007/0098128 A1 * 5/2007 Ishida et al. ................. 375/376

FOREIGN PATENT DOCUMENTS

JP   2005-92885    4/2005
JP   2005-141434   6/2005

* cited by examiner

*Primary Examiner*—Sam K Ahn
(74) *Attorney, Agent, or Firm*—Young & Thompson

(57) ABSTRACT

A timing analysis apparatus in an integrated logical circuit according to the present invention includes a jitter information generation unit for generating period jitter information of an operational clock in response to a power supply/ground noise, a jitter information storage unit for storing the generated period jitter information, and a timing analysis unit for performing a timing analysis of the integrated logical circuit based on the stored period jitter information.

10 Claims, 20 Drawing Sheets

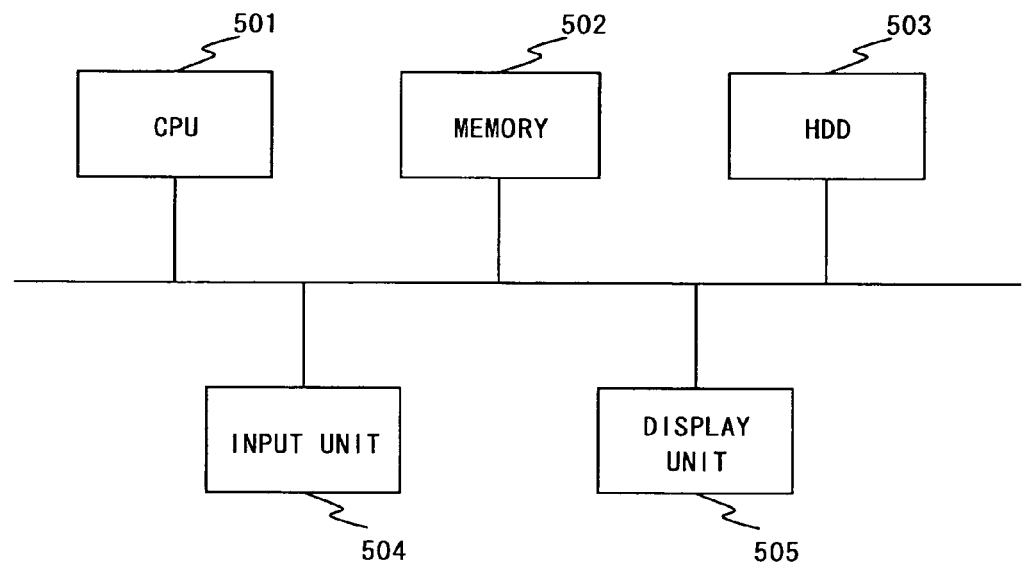
Fig. 21
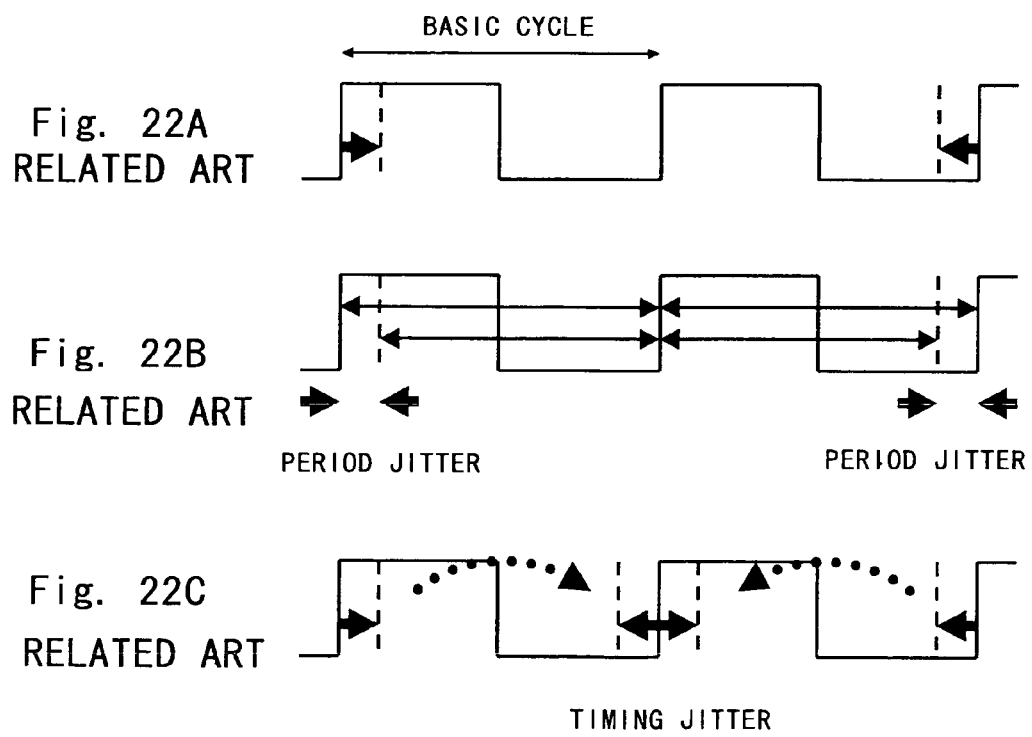
Fig. 22A RELATED ART
Fig. 22B RELATED ART
Fig. 22C RELATED ART

RELATED ART

TIMING ANALYSIS APPARATUS AND METHOD OF TIMING ANALYSIS

BACKGROUND OF THE INVENTION

1. Field of the Invention

The present invention relates to a timing analysis apparatus and a method of timing analysis, and particularly to a timing analysis apparatus and a method of timing analysis considering influences of a power supply/ground noise.

2. Description of Related Art

The influences of a power supply/ground noise is becoming more and more apparent, designing a high-speed logical circuit. Especially a jitter of a clock signal input to the logical circuit (the jitter of the clock signal hereinafter merely referred to as a jitter) is conventionally known as one of the influences of the power supply/ground noise. The jitter is an important design index in a circuit generating a high-speed signal such as a PLL (Phase Locked Loop), DLL (Delay Locked Loop), USB (Universal Serial Bus), and DDR I/F (Double Data Rate I/F).

Conventionally analysis and design with a consideration over the jitter have been performed in a timing analysis in a circuit design so as to prevent from a malfunction in the logical circuit due to the power supply/ground noise.

However in recent years, circuit design is becoming more complicated along with higher speed of the logical circuit. Further, a level of designing the logical circuit becomes higher and higher, it is more difficult to design a logical circuit that satisfies the design index considering the jitter. Therefore, a more appropriate method to consider the jitter has been demanded.

There are known two jitters generated in a clock signal (operational clock) supplied to the logical circuit, which are a period jitter and a timing jitter. The period jitter and timing jitter are described hereinafter in detail with reference to FIGS. 22A to 22C. FIG. 22A is a basic cycle of the clock signal. FIG. 22B is the period jitter for deviation of clock signals. FIG. 22C is the timing jitter for deviation of clock signals.

As shown in FIG. 22B, the period jitter is a jitter generated between adjacent edges or two clock edges of a constant interval, and a maximum value of an amount of deviation from the basic cycle aggregated by each edge. As shown in FIG. 22C, the timing jitter expresses a blur width of an edge generated for a long time.

FIG. 23 is a configuration of a conventional timing analysis apparatus. In the conventional analysis apparatus, a power supply/ground noise waveform is stored at a power supply/ground noise waveform storage unit 901. A power supply voltage calculation unit 902 calculates power supply voltage information based on the power supply/ground noise waveform and store it to a power supply voltage information storage unit 903.

A delay time calculation unit 906 calculates delay information based on the power supply voltage information and the netlist and a delay library. And the delay time calculation unit 906 stores the delay information to a delay information storage unit 907. Incidentally, the netlist is stored in a netlist storage unit 904. The delay library is stored in a delay library storage unit 905. Timing constraint information is stored in a timing constraint storage unit 908. A timing analysis unit 909 performs a timing analysis according to the timing constraint and the delay information. Then the timing analysis unit 909 stores a result of the analysis to a timing analysis result storage unit 910.

In a conventional timing analysis apparatus, a timing jitter value is used to consider the influence of the power supply/ground noise to timings. A timing window (not shown) may be used together.

The power supply voltage calculation unit 902 calculates a maximum value VMAX and a minimum value VMIN between a power supply (VDD) and a ground (VSS) from the power supply/ground noise waveform using:

$$V_{MAX} = \operatorname*{MAX}_{t=-\infty}^{\infty}(V_{DD}(t) - V_{SS}(t)) \text{ and} \quad \text{(Equation 1)}$$

$$V_{MIN} = \operatorname*{MIN}_{t=-\infty}^{\infty}(V_{DD}(t) - V_{SS}(t)), \quad \text{(Equation 2)}$$

and creates power supply voltage information. Further, when using the timing window together, time range to refer to the maximum value VMAX and the minimum value VMIN is limited depending on the time range.

Further, the delay time calculation unit 906 refers to the power supply voltage information, and calculates a maximum value TMAX and a minimum value TMIN of a delay time that corresponds to the maximum value VMAX and the minimum value VMIN of the power supply voltage value, using:

$$T_{MAX} = f(V_{MAX}, \text{AnotherParameters} \dots) \quad \text{(Equation 3)}$$

and $$T_{MIN} = f(V_{MIN}, \text{AnotherParameters} \dots), \quad \text{(Equation 4)}$$

and generates the delay information. The delay information includes a delay time in a logical cell or a register cell, a delay time between cells (lines), a setup time or a hold time of the register cell and so on.

Further, the timing analysis unit 909 performs the timing analysis using the delay time included in the delay information. At this time the maximum value TMAX and the minimum value TMIN of the delay time are combined in a way that a result of the timing analysis becomes a worst case. The timing analysis unit 909 considers the influence of the power supply/ground noise in this manner. In the timing analysis, a setup analysis for analyzing that a signal is delivered before a subsequent clock, and a hold analysis for analyzing that a signal is delivered after a current clock are performed.

FIG. 24A is an example of the Setup analysis. FIG. 24B is an example of the Hold analysis. In this example, a path diverges to P901 and P902 after clock path 3. The two paths P901 and P902 are input in common to a register 2. As shown in FIG. 24A, the maximum value TMAX of the delay time is used to the path P901 that passes clock path 1, register 1, data path 1, the register 2 in this order. The minimum value TMIN of the time delay is used to the path P902 that passes clock path 2, the register 2 in this order. Further as shown in FIG. 24B, contrary to the setup analysis, the minimum value TMIN of the delay time is used to the path P901, and the maximum value TMAX of the delay time is used to the path P902 in the hold analysis.

As a conventional timing analysis apparatus, techniques disclosed in Japanese Unexamined Patent Application Publication No. 2005-092885 and Japanese Unexamined Patent Application Publication No. 2005-141434 are known.

As described in the foregoing, with a consideration over the influence of the power supply/ground noise, only the timing jitter has been covered as in equations 1 to 4 in the timing verification, because the timing jitter can be easily calculated from the power supply/ground noise jitter waveform.

However it has now been discovered that using the timing jitter in the timing verification of the logical circuit decreases verification accuracy (analysis accuracy) of the timings and also hinders from speeding up the logical circuit. That is, using the timing jitter in the timing verification could lead to misjudging a timing violation where no timing violation occurs actually. This creates a strict analysis that a timing violation is easily determined, thereby making it difficult to speed up the logical circuit.

SUMMARY OF THE INVENTION

According to an aspect of the present invention, there is provided a timing analysis apparatus of an integrated logical circuit that comprises a jitter information generation unit generating period jitter information, which is jitter information between adjacent clock edges in an operational clock, a jitter information storage unit storing the period jitter information generated in the jitter information generation unit, and a timing analysis unit performing a timing analysis of the integrated logical circuit based on the period jitter information stored to the jitter information storage unit. The timing analysis apparatus of this invention performs an analysis considering the period jitter, so an analysis is performed accurately than a timing analysis considering a timing jitter. Thereby speed up of the logical circuit is realized.

According to another aspect of the present invention, there is provided a timing analysis method that is a timing analysis method of a timing analysis process of an integrated logical circuit performed by a computer which comprises generating period jitter information, which is jitter information between adjacent clock edges in an operational clock in response to a power supply/ground noise, storing the generated period jitter information to a jitter information storage unit, and performing a timing analysis to the integrated logical circuit based on the stored period jitter information. The timing analysis is performed with a consideration of the period jitter by the timing analysis method of this invention. Thus analysis is performed accurately than a timing analysis considering a timing jitter. Thereby speed up of the logical circuit is realized.

The present invention provides a timing analysis apparatus and a timing analysis method for improving an accuracy of the timing verification and speeding up the logical circuit.

BRIEF DESCRIPTION OF THE DRAWING

The above and other objects, advantages and features of the present invention will be more apparent from the following description taken in conjunction with the accompanying drawings, in which:

FIG. 21 is a hardware configuration diagram of a system according to the present invention;

FIGS. 22A to 22C are waveform diagrams explaining a period jitter and a timing jitter according to a conventional technique;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A timing analysis system according to a first embodiment of the present invention is described hereinafter in detail. The timing analysis system of this embodiment calculates a period jitter based on Power Supply Jitter Response (hereinafter referred to as PSJR). Then the timing analysis system performs a timing verification based on the calculated period jitter.

Figure 1:
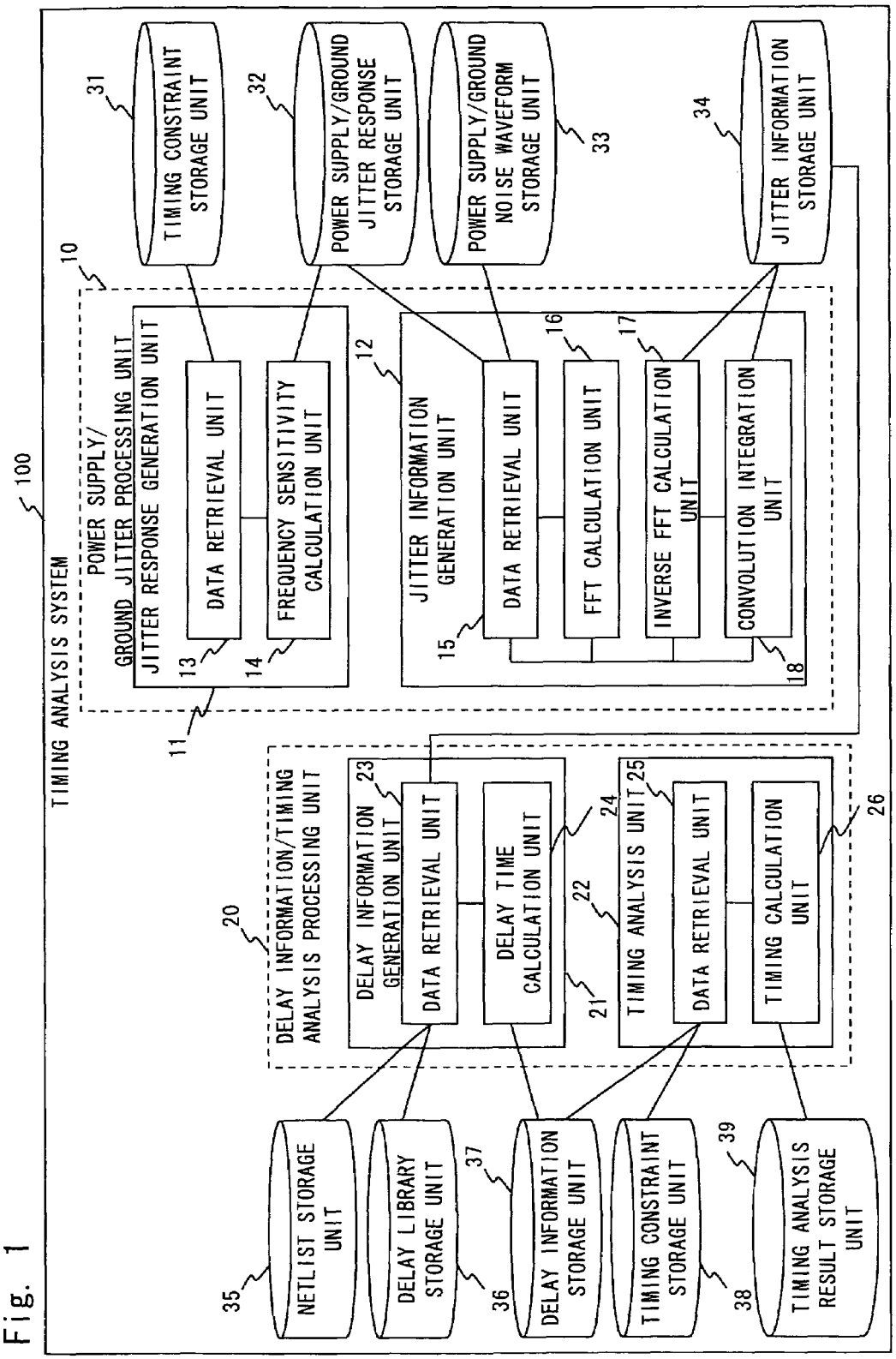
FIG. 1 is a configuration diagram of a timing analysis system according to the present invention.

FIG. 1 is a configuration of the timing analysis system according to this embodiment. As shown in FIG. 1, a timing analysis system 100 includes a power supply/ground jitter processing unit 10, a delay information and timing analysis processing unit 20, and storage units. The power supply/ground jitter processing unit 10 processes information regarding power supply/ground jitter. The delay information and timing analysis processing unit 20 processes delay information and performs timing analysis. The storage units store respective information. As the storage units, the timing analysis system 100 includes a timing constraint storage unit 31 for storing a timing constraint, a PSJR storage unit 32 for storing a PSJR, a power supply/ground noise waveform storage unit 33 for storing power supply/ground noise waveform, a jitter information storage unit 34 for storing jitter information, a netlist storage unit 35 for storing a netlist, a delay library storage unit 36 for storing a delay library, a delay information storage unit 37 for storing the delay information, a timing constraint storage unit 38 for storing the timing constraint, and a timing analysis result storage unit 39 for storing a timing analysis result.

The power supply/ground jitter processing unit 10 includes a jitter response generation unit 11 and a jitter information generation unit 12.

The jitter response generation unit 11 includes a data retrieval unit 13 and a frequency sensitivity calculation unit 14. Then the jitter response generation unit 11 retrieves the timing constraint and generates the PSJR. Specifically, the jitter response generation unit (jitter response information generation unit) 11 retrieves the timing constraint (timing constraint information) and generates the PSJR (jitter response information) responding to the power supply ground noise based on the timing constraint.

The timing constraint is stored at the timing storage unit 31 in advance. The data retrieving unit (timing constraint retrieving unit 13) retrieves the timing constraint from the timing constraint storage unit 31. The timing constraint includes a clock latency and a clock cycle. The clock latency is a delay from a signal input/output terminal to be a base point (time 0) to a clock synchronous sequential circuit in a clock synchronous sequential circuit having a pipeline configuration to be verified. Incidentally, the base point is set to a signal input/output of a previous stage of a root-clock-buffer (root node—clock generation circuit—buffer circuit) arranged and wired to have equal delays. The clock latency may be a delay from the root-clock-buffer to the clock synchronous sequential circuit.

A frequency sensitivity calculation unit 14 refers to the clock cycle and the clock latency. The clock cycle and the clock latency are defined by each clock domain included in the retrieved timing constraint. Then a degree of the influence to the period jitter by the power supply/ground noise is generated as a PSJR. After that, the PSJR is stored to the power supply/ground jitter response storage unit 32. The PSJR is a curve indicating a sensitivity (frequency response) of the period jitter against the power supply/ground noise.

The jitter information generation unit 12 includes a data retrieval unit 15, a FFT (Fast Fourier Transform) calculation unit 16, an inverse FFT calculation unit 17, and a convolution integration unit 18. The jitter information generation unit 12 retrieves the PSJR and the power supply/ground noise waveform, and generates the jitter information based on the retrieved PSJR and the power supply/ground noise waveform. Thus, the jitter information generation unit 12 generates the jitter information (i.e. period jitter information) between adjacent clocks in response to the power supply/ground noise.

The power supply/ground noise waveform is stored at the power supply/ground noise waveform storage unit 33 in advance. Once the power supply/ground jitter response is stored at the power supply/ground litter response storage unit 32, the data retrieval unit (the power supply ground jitter response and noise waveform retrieval unit) 15 retrieves the power supply/ground noise waveform from the power supply/ground noise waveform storage unit 33 and also the PSJR from the power supply/ground jitter response storage unit 32.

The FFT calculation unit (Fourier transform unit) 16 transforms information of the time domain into a frequency domain by performing Fourier transform. Inverse FFT calculation unit (Inverse Fourier transformation unit) 17 transforms information of frequency domain into the time domain by performing an inverse Fourier transform. The convolution integration unit 18 performs convolution integration against the two information of a same domain.

For example the inverse FFT calculation unit 17 transforms the retrieved PSJR into time domain by performing an inverse Fourier transform. Then the convolution integration unit 18 convolves and integrates the PSJR of the time domain gained by the Invert Fourier transform and the retrieved power supply/ground noise waveform of the time domain, and generates a jitter information, and stores the jitter information to the jitter information storage unit 34.

For example the FFT calculation unit 16 transforms the retrieved power supply/ground noise waveform into a frequency domain by performing a Fourier transform. Then the convolution integration unit 18 convolves and integrates the retrieved PSJR and a result of the Fourier transform of the power supply/ground noise waveform. Then the inverse FFT calculation unit 17 transforms a result of the convolution integration by performing an inverse Fourier transform, and generates the jitter information.

The delay information and timing analysis processing unit 20 includes a delay information generation unit 21 and the timing analysis unit 22.

Figure 23:
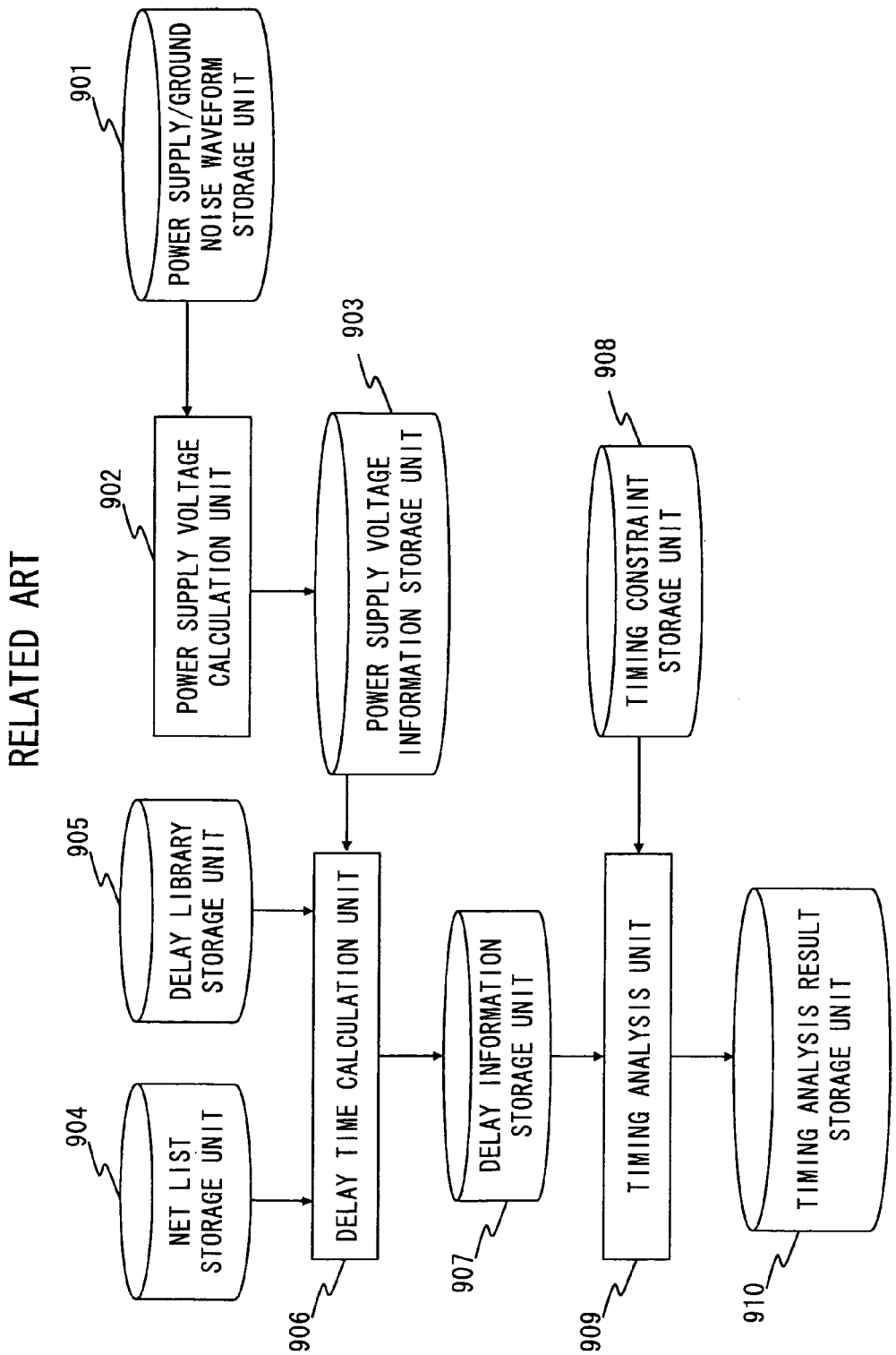
FIG. 23 is a configuration diagram of a timing analysis system according to a conventional technique.
Figure 24A:
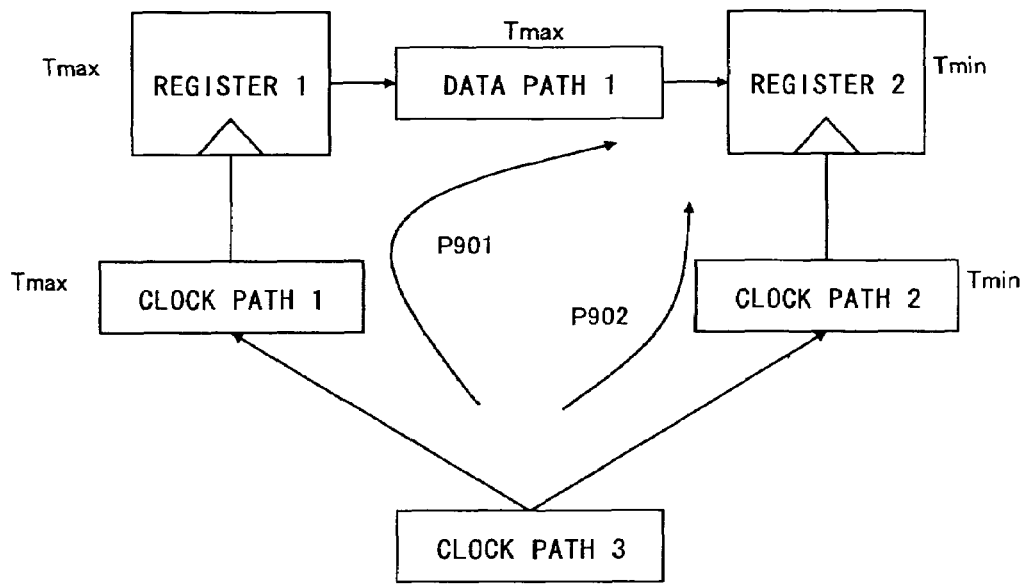
FIGS. 24A and 24B are circuit diagrams explaining a timing analysis method according to a conventional technique.
Figure 24B:
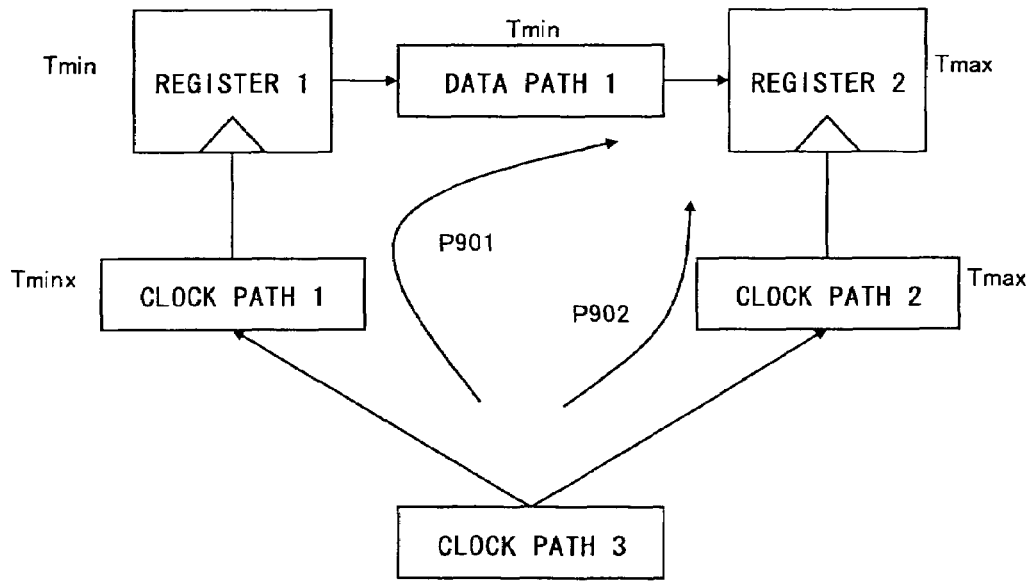

The delay information generation unit 21 includes a data retrieval unit 23 and a delay time calculation unit 24. The delay information generation unit 21 retrieves the netlist, the delay library, the jitter information, and generates the delay information. That is, the delay information generation unit 21 retrieves the netlist (netlist information), the delay library (delay library information), and the jitter information (the period jitter information). The delay information generation unit 21 corrects the delay time in cell and line delay time based on the netlist and the delay library by using the jitter information, and generates the delay information. For example the function that refers to the jitter information to calculate the delay time or corrects the result of the delay time calculation may be added to the conventional delay time calculation unit 906 of FIG. 23 for the delay information generation unit 21 of this embodiment.

The netlist is stored at the netlist storage unit 35 in advance. The delay library is stored at the delay library storage unit 36 in advance. Once the jitter information is stored to the jitter information storage unit 34 by the jitter information generation unit 12, the data retrieval unit (netlist, delay library and jitter information retrieval unit) 23 retrieves the netlist from the netlist storage unit 35, the delay library from the delay library storage unit 36, and the jitter information from the jitter information storage unit 34.

The delay time calculation unit 24 refers to the retrieved netlist, delay library, and jitter information. The delay time calculation unit 24 calculates the delay time in cell and the line delay time to generate the delay information, and then stores the delay information to the delay information storage unit 37.

The timing analysis unit 22 includes a data retrieval unit 25 and a timing calculation unit 26. The timing analysis unit 22 retrieves the delay information and the timing constraint to perform the timing analysis. That is, the timing analysis unit 22 performs the timing analysis based on the jitter information (the period jitter information) generated by the jitter information generation unit 12. The timing analysis unit 22 performs the timing analysis with a sum of a maximum value of the delay time in cell and a maximum value of the line delay time, or a sum of a minimum value of the delay time in cell and a minimum value of the line delay time as a delay time of a path. The conventional timing analysis unit 909 of FIG. 23 may be used for the timing analysis unit 22 of this embodiment.

The timing constraint is stored at the timing constraint storage unit 38 in advance. Once the delay information is stored to the delay information storage unit 37 by the delay information generation unit 21, the data retrieval unit (delay information and timing constraint retrieval unit) 25 retrieves the delay information from the delay information storage unit 37 and the timing constraint from the timing constraint storage unit 38.

The timing calculation unit 26 refers to the retrieved delay information and timing constraint, and performs the timing analysis, and then stores a result of the timing analysis to the timing analysis result storage unit 39.

Figure 2:
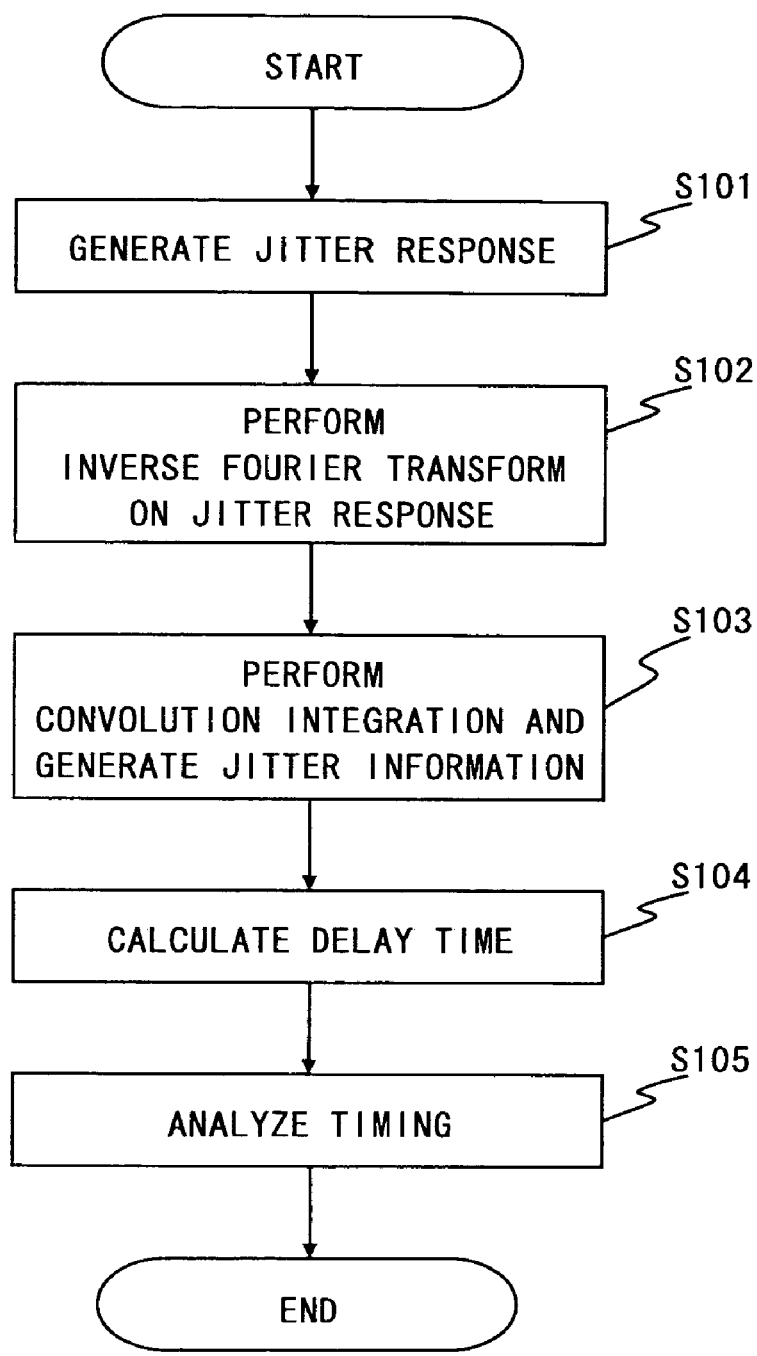
FIG. 2 is a flowchart of a timing analysis method according to the present invention.

A timing analysis method of this embodiment is described hereinafter in detail. FIG. 2 is the timing analysis method performed by the timing analysis system 1 of FIG. 1.

Firstly the jitter response generation unit 11 retrieves the timing constraint by the data retrieval unit 13 and generates a jitter response by the frequency sensitivity calculation unit 14 based on the retrieved timing constraint (S101). An example of the PSJR in a single cycle synchronous circuit having a clock cycle t is described hereinafter in detail.

Figure 3:
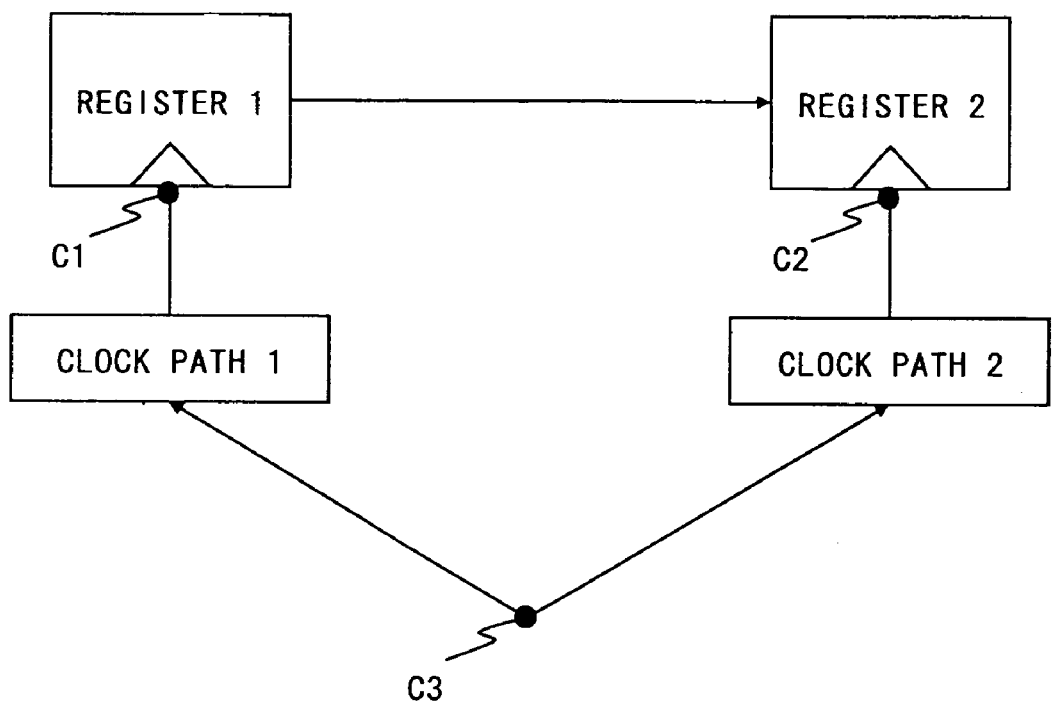
FIG. 3 is a circuit diagram explaining the timing analysis method according to the present invention.

As an example, a setup analysis in a synchronous circuit formed by clock paths 1 and 2, and registers 1 and 2 as in FIG. 3 is described hereinafter in detail. A clock waveform of the cycle t is propagated and clock path having equal delay are formed to each of nodes C1, C2, and C3 of the synchronous circuit. Further, noise having the cycle T is generated in power supply (or ground) of an entire synchronous circuit.

Figure 4:
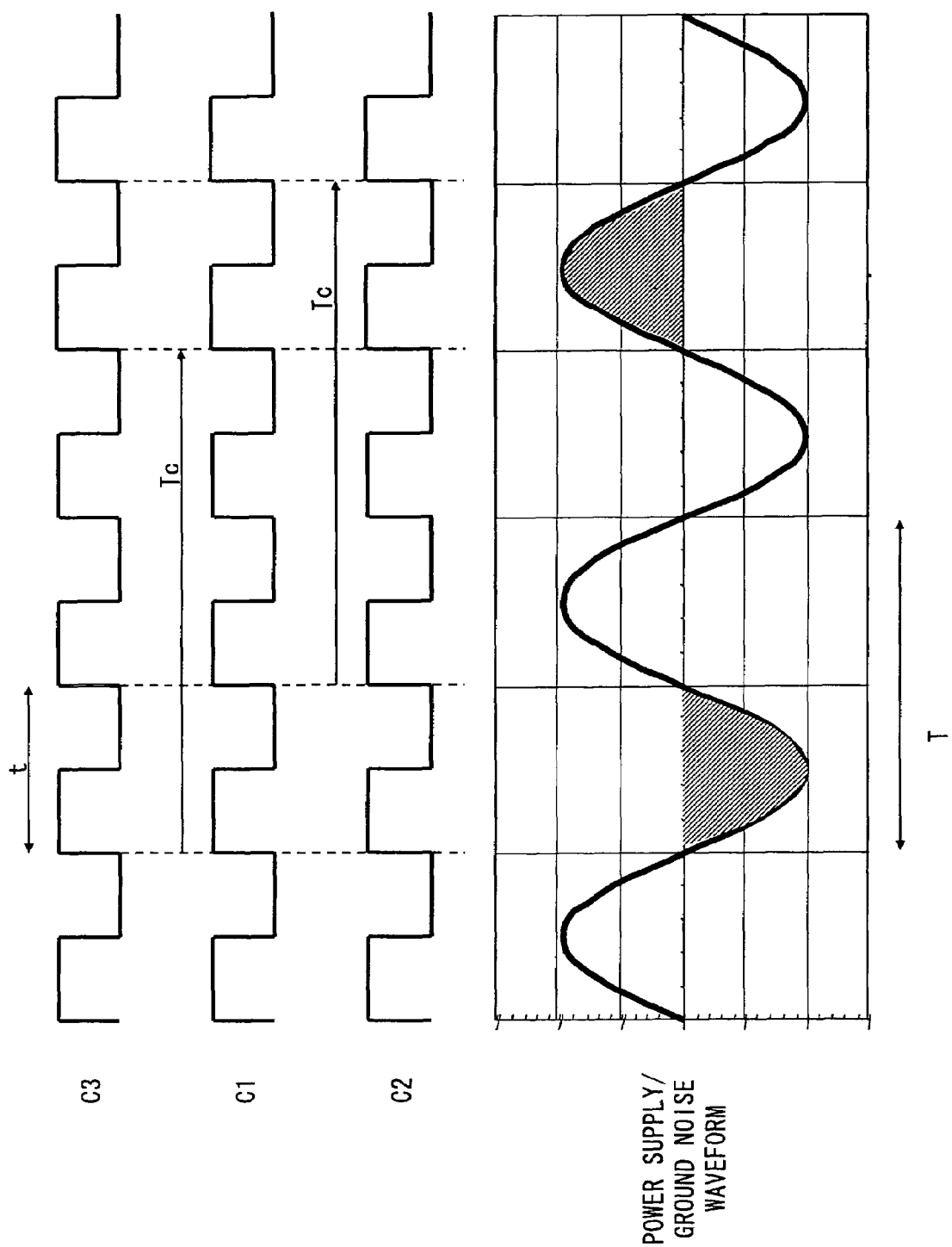
FIG. 4 is a timing chart explaining the timing analysis method according to the present invention.

FIG. 4 is a noise waveform of clock waveforms and power supply (or ground) of the nodes C1 to C3. In FIG. 4, a clock latency Tc is assumed to be 1.5 times of the noise cycle T=1/v. At this time a register 2 refers to a clock signal one cycle behind the register 1. Thus time difference between the nodes C1 and C2 is the clock cycle t as shown in FIG. 4. Accordingly an influence of the power supply/ground noise to the clock signal is generated in shaded portion, which is the difference of the nodes C1 and C2. The influence of the shaded portion is detected as a period jitter. An area F(v) of the shaded portion can be expressed as:

$$F(v) = \int_0^{2\pi t} 2\alpha \sin\left(\frac{\tau}{T}\right) d\tau = 2\alpha \frac{1 - \cos(2\pi t v)}{v} \quad \text{(Equation 5)}$$

Figure 5:
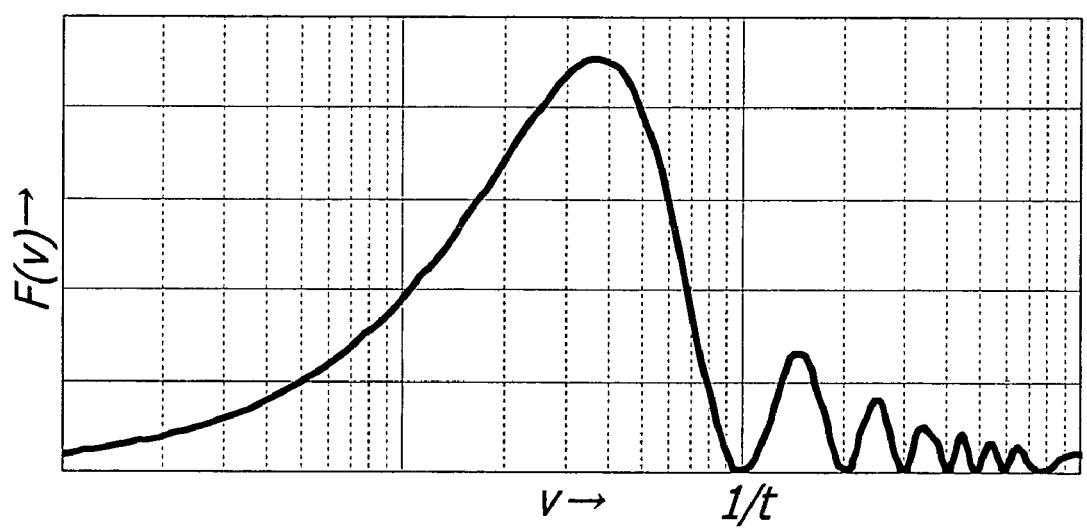
FIG. 5 is a waveform diagram of a power supply ground jitter response used in the timing analysis method according to the present invention.

In this case, the area F(v) is referred to as PSJR. FIG. 5 shows a curve line of the PSJR calculated by the equation 5.

Figure 6:
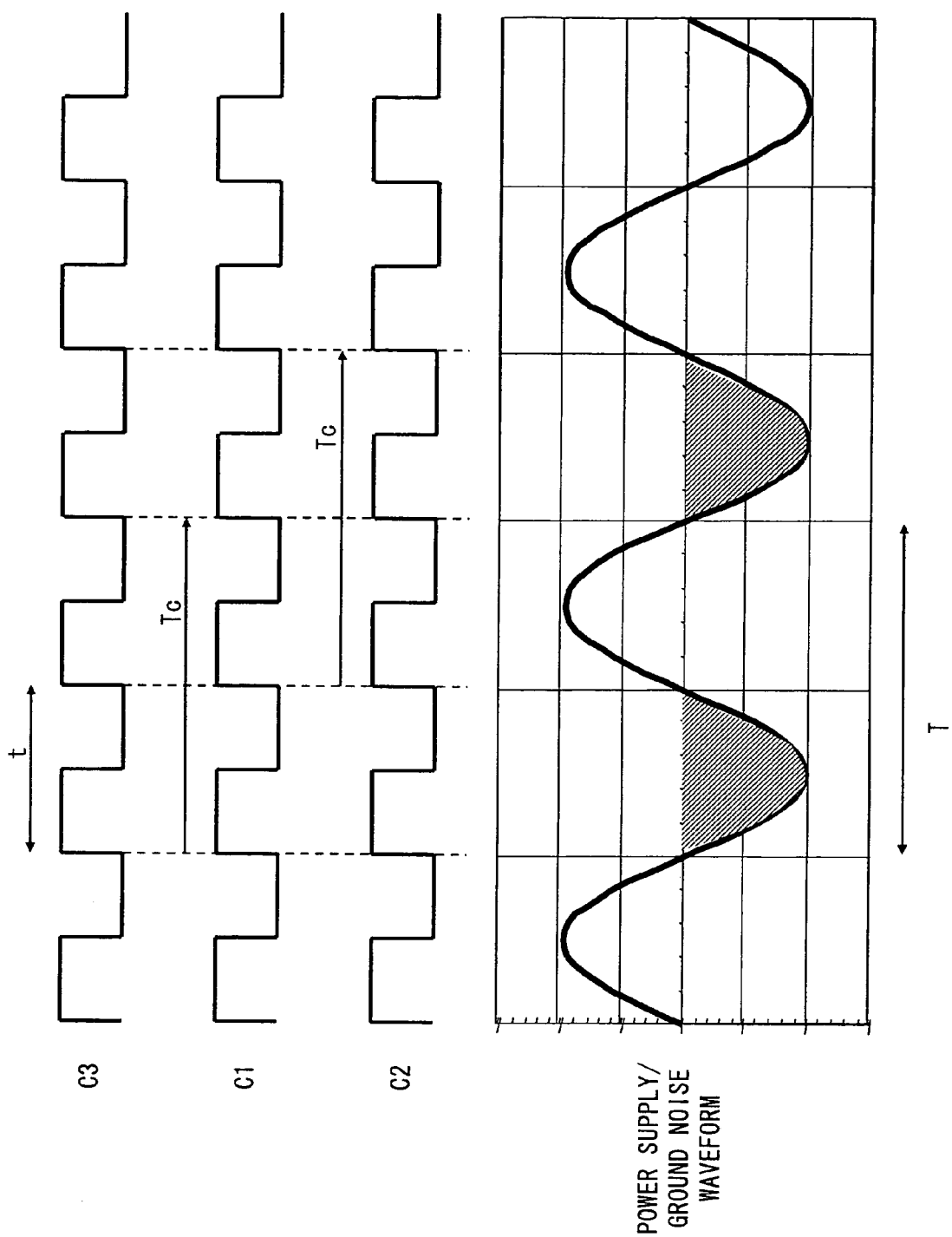
FIG. 6 is a timing chart explaining the timing analysis method according to the present invention.

On the other hand as in FIG. 6, if the clock latency Tc is limited and equals to an integral multiple of the noise circle, which is equals to nT (where n is a natural number), the power supply/ground noise is not acknowledged to be received because the shaded portions of the nodes C1 and C2 completely match. FIG. 6 is an example of the clock latency Tc=2×T. Incorporating an effect of Tc=nT and generalizing the equation 5, the PSJR can be expressed as:

$$F(v) = \alpha \left[ \int_0^{2\pi t} \sin\left(\frac{\tau}{T}\right) d\tau - \int_{-2\pi Tc}^{2\pi(t-Tc)} \sin\left(\frac{\tau}{T}\right) d\tau \right] \quad \text{(Equation 6)}$$

$$= \alpha \frac{1 - \cos(2\pi t v) + \cos(2\pi(t - T_c)v) - \cos(-2\pi T_c v)}{v}$$

The jitter response generation unit 11 calculates the PSJR using the equation 6.

Figure 7:
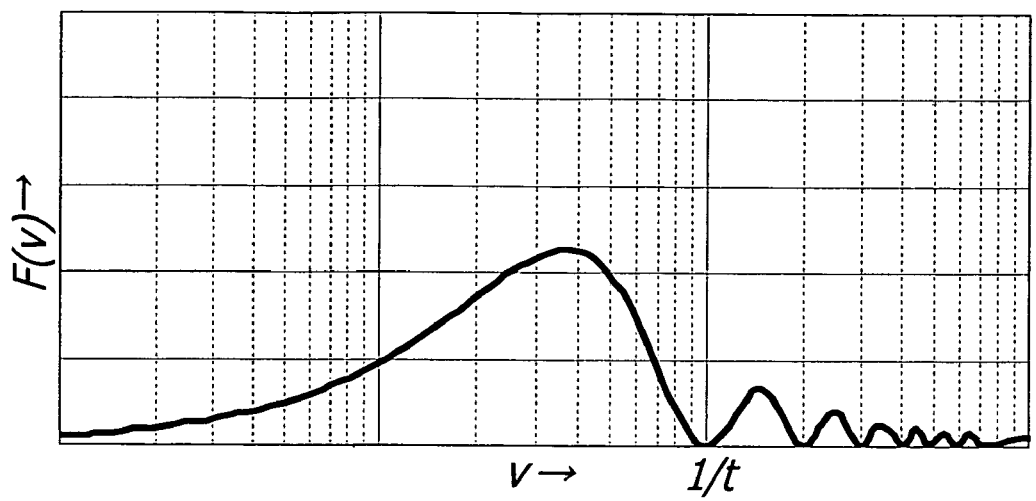
FIG. 7 is a waveform diagram of the power supply/ground jitter response used in the timing analysis method according to the present invention.
Figure 8:
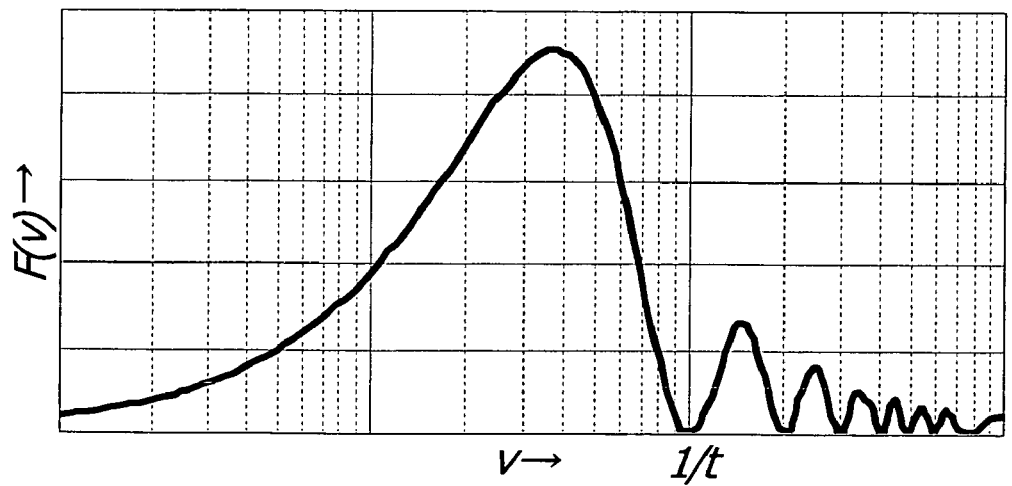
FIG. 8 is a waveform diagram of the power supply/ground jitter response used in the timing analysis method according to the present invention.
Figure 9:
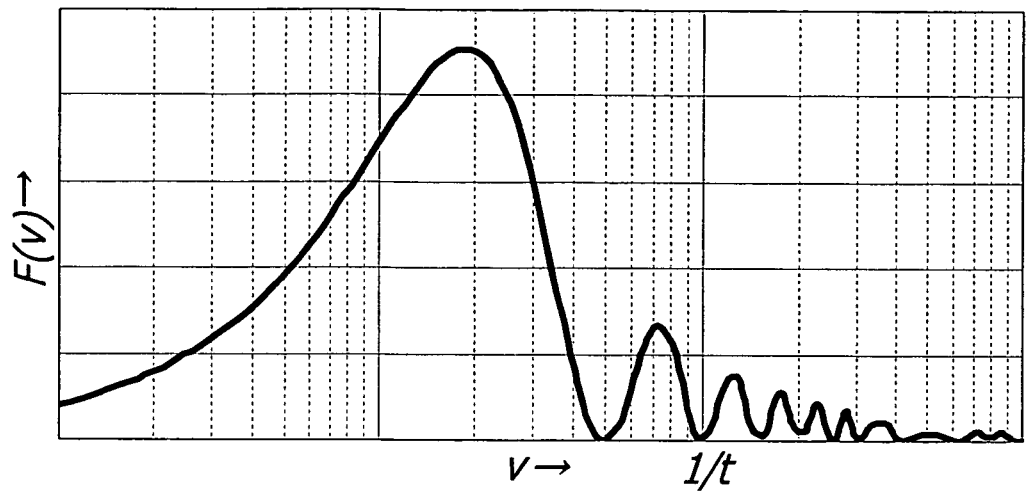
FIG. 9 is a waveform diagram of the power supply/ground jitter response used in the timing analysis method according to the present invention.
Figure 10:
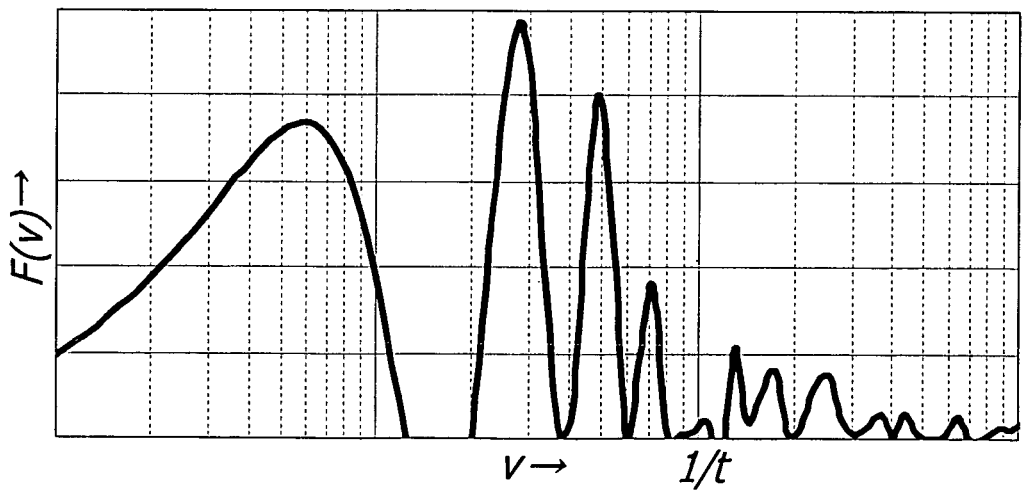
FIG. 10 is a waveform diagram of the power supply/ground jitter response used in the timing analysis method according to the present invention.

FIGS. 7 to 10 are specific example of the PSJR calculated using the equation 6, showing curve lines of the PSJR in the following cases. FIG. 7 is a case of the clock latency Tc=5 ns. FIG. 8 is a case of the clock latency Tc=10 ns. FIG. 9 is a case of the clock latency Tc=20 ns. FIG. 10 is a case of the clock latency Tc=50 ns.

Subsequent to S101 of FIG. 2, the jitter information generation unit 12 retrieves the PSJR by the data retrieval unit 15 and performs an inverse Fourier transform against the retrieved PSJR by the inverse FFT calculation unit 17 (S102). The inverse Fourier transform is performed by a general method. For example the inverse Fourier transform of the PSJR calculated by the equation 6 can be calculated using:

$$F(v) = \int_{-\infty}^{\infty} f(t) e^{-j(2\pi v)t} dt \quad \text{(Equation 7)}$$

The jitter information generation unit 12 transforms the PSJR into time domain using the equation 7.

Then the jitter information generation unit 12 retrieves the power supply/ground noise waveform by the data retrieval unit 15, convolves and integrates the time domain component and the power supply/ground noise waveform by the convolution integration unit 18 to generate the jitter information (S103).

The convolution integration is performed by a general method. For example as in:

$$PJ = \text{Max}[f(t) \otimes V(t)], \quad \text{(Equation 8)}$$

the time domain component (f(t)) that is gained by performing inverse Fourier transform against the PSJR and the retrieved power supply/ground noise waveform (V(t)) is convolved and integrated, and a maximum value of it is set as the period jitter value PJ. The jitter information generation unit 12 calculates the period jitter value PJ using the equation 8 and outputs the period jitter value PJ as the jitter information. The period jitter value may be calculated using a formula for calculating the integrated value or the period jitter of a general method instead of using the equation 8.

Then the delay information generation unit 21 retrieves the netlist, the delay library, and the jitter information by the data retrieval unit 23. And the delay information generation unit 21 calculates the delay time by the delay time calculation unit 24 based on the retrieved information (S104).

At this time the delay information generation unit 21 firstly calculates cell delay value of each cell Tcell and line delay value between cells Twire from the netlist and the delay library. After that a minimum value Tmin and a maximum value Tmax of each delay value is calculated by equations 9 to 12 using the period jitter value PJ calculated by the equation 8. The delay information generation unit 21 calculates a minimum value Tcellmin of the cell delay value using:

$$T_{cell\,min} = T_{cell} - \frac{PJ \times T_{cell}}{T_c} \quad \text{(Equation 9)}$$

The delay information generation unit 21 calculates a maximum value Tcellmax of the cell delay value using:

$$T_{cell\,max} = T_{cell} + \frac{PJ \times T_{cell}}{T_c} \quad \text{(Equation 10)}$$

The delay information generation unit 21 calculates a minimum value Twiremin of the line delay value using:

$$T_{wire\,min} = T_{wire} - \frac{PJ \times T_{wire}}{T_c} \quad \text{(Equation 11)}$$

The delay information generation unit 21 calculates a maximum value Twiremax of the line delay value using:

$$T_{wire\,max} = T_{wire} + \frac{PJ \times T_{wire}}{T_c} \quad \text{(Equation 12)}$$

Then the delay information generation unit 21 outputs the calculated values as the delay information. As in the equations 9 to 12, the minimum value is a value gained by multiplying Tcell by (1−(PJ/TC)) or a value gained by multiplying Twire by (1−(PJ/TC)), while the maximum value is a value gained by multiplying Tcell by (1+(PJ/TC)) or a value gained by multiplying Twire by (1+(PJ/TC)).

Then the timing analysis unit 22 retrieves the delay information and the timing constraint by the data retrieval unit 25, and performs the timing analysis by the timing calculation unit 26 based on the retrieved information (S105).

At this time the timing analysis unit 22 calculates a delay value Tpass of each path passing cells. The delay value Tpass is a total delay value of a clock path to which a corresponding cell belongs. Generally a plurality of clock paths exists in one clock domain. In this case as an example, the clock path delay value is calculated for each cell. Generally a branch of a pas exists in back stage in CTS (Clock Tree Synthesis), a minimum delay value of tracing all branches to an end point (F/F) is set as Tpass.

Figure 11:
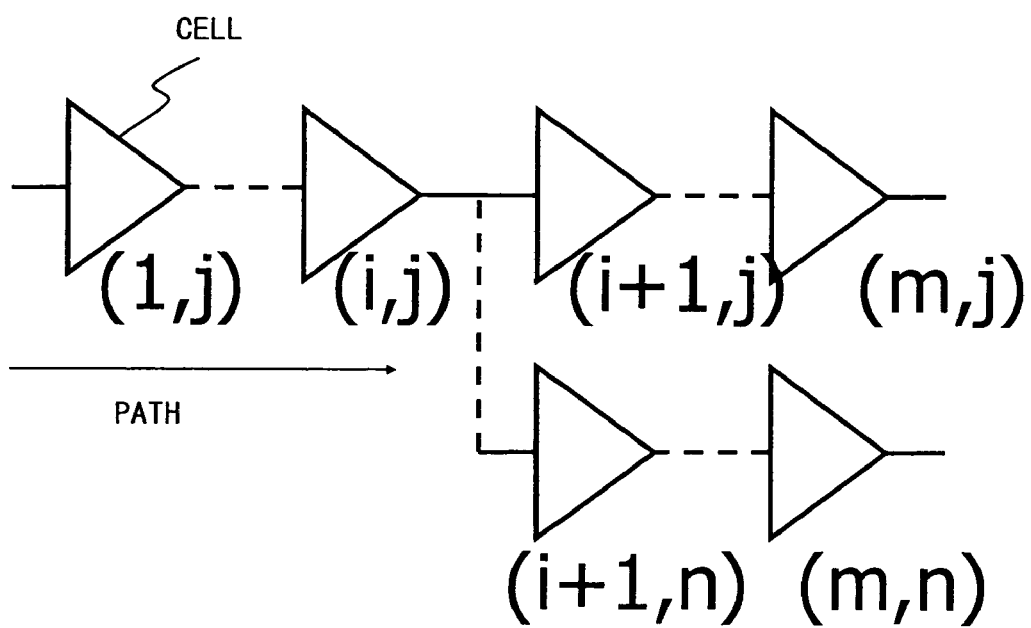
FIG. 11 is a circuit diagram explaining the timing analysis method according to the present invention.

For example as in FIG. 11 where a circuit is formed by a plurality of cells, the delay value Tpass for a cell (i,j) can be calculated by:

$$T_{pass}(i,j) = \text{Min}\left[\sum_{k=1}^{m}(T_{cell}(k,j) + T_{wire}(k,j))\right] \quad \text{(Equation 13)}$$

Figure 12:
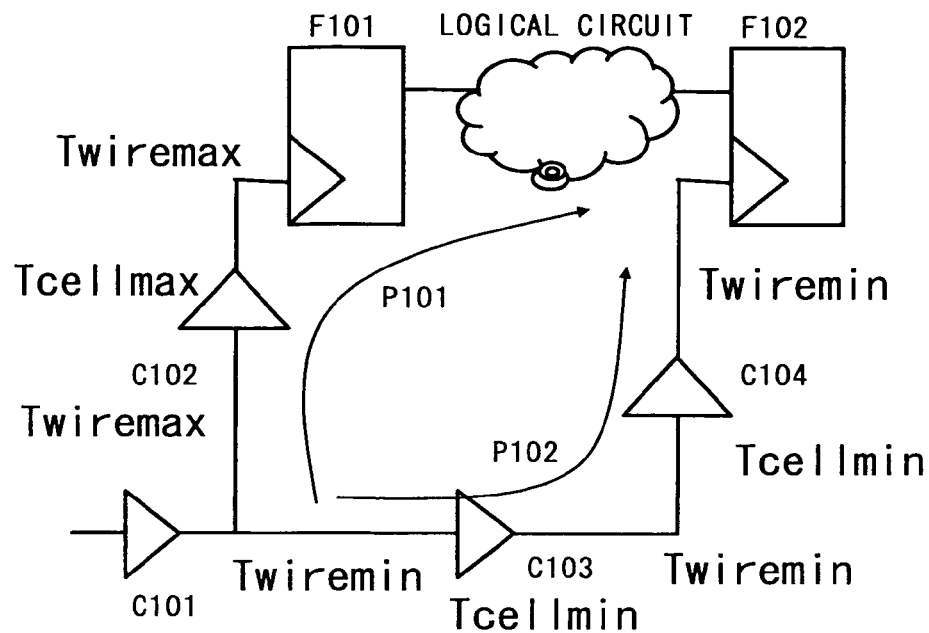
FIG. 12 is a circuit diagram explaining the timing analysis method according to the present invention.
Figure 13:
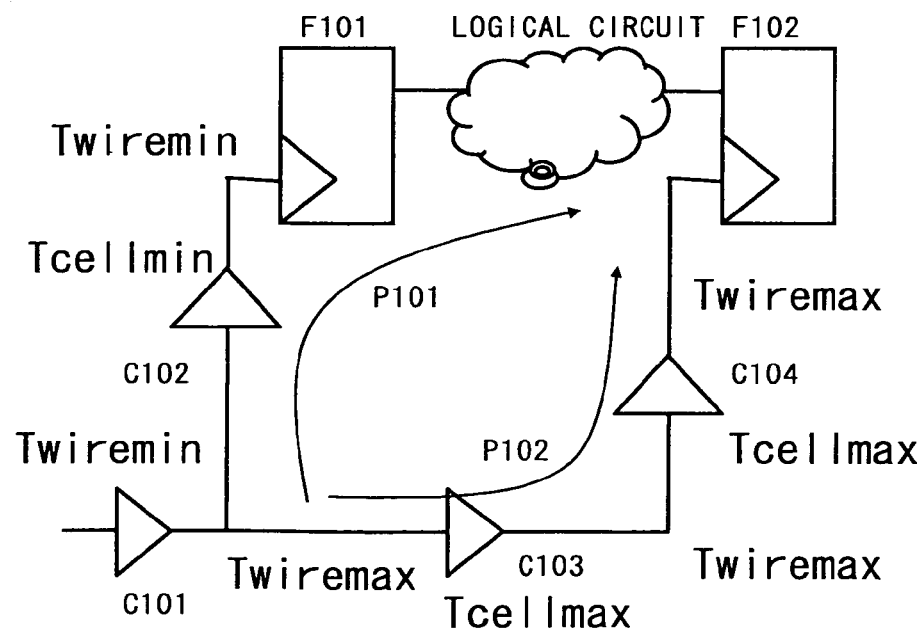
FIG. 13 is a circuit diagram explaining the timing analysis method according to the present invention.

Then the timing analysis unit 22 performs a timing verification of the worst case using the minimum value Tcellmin and the maximum value Tcellmax of the cell delay value calculated using the equations 9 to 12, and the minimum value Twiremin and the maximum value Twiremax of the line delay value. FIG. 12 is an example of the setup analysis. FIG. 13 is an example of the hold analysis. In this example, two paths P101 and P102 is provided between cell C101 and flip-flop F102.

As shown in FIG. 12, in the setup analysis, Twiremax and Tcellmax are used for the path P101 that passes C101, C102, F101, and F102 in this order. Further, Twiremin and Tcellmin are used for the path P102 that passes C101, C103, C104, and F102 in this order. As shown in FIG. 13, in the hold analysis, Twiremin and Tcellmin are used for the path P101. Further, Twiremax and Tcellmax are used for the path P102.

Figure 14:
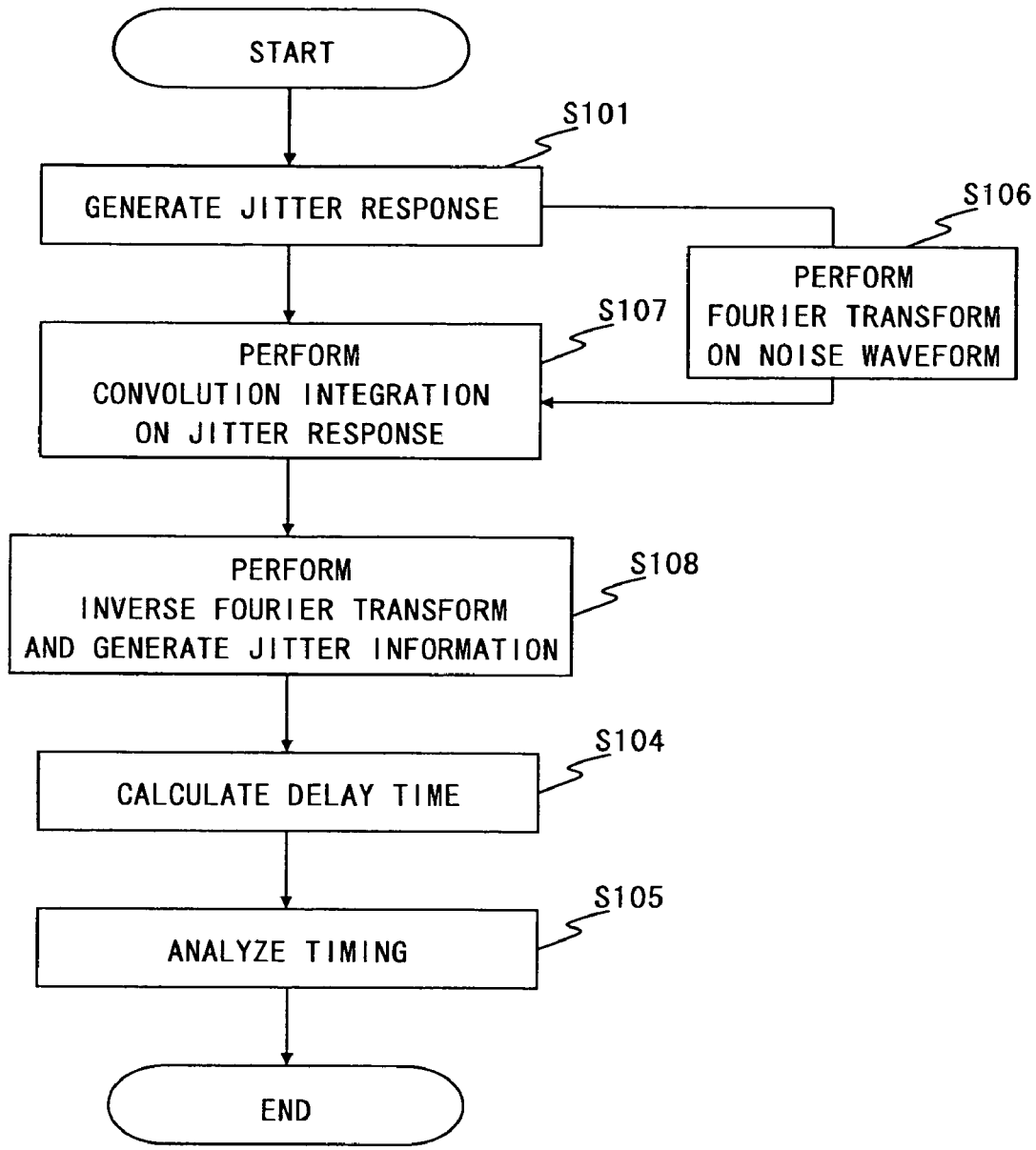
FIG. 14 is a flowchart of the timing analysis method according to the present invention.

In the timing analysis method of FIG. 2, although the jitter information is generated by the inverse Fourier transform and the convolution integration, it is not limited to this. The jitter information may be generated using the Fourier transform, the convolution integration, and the inverse Fourier transform as in FIG. 14. That is, the jitter information generation unit 12 performs a Fourier transform against the power supply/ground noise waveform by the FFT calculation unit 16 (S106), performs a convolution integration against the PSJR and a result of the Fourier transform by the convolution integration unit 18 (S107), performs an inverse Fourier transform against a result of the convolution integration by the inverse FFT calculation unit 17, and generates the jitter information (S108). Other processes are identical to those in FIG. 2.

As described in the foregoing in this embodiment, the PSJR generated from the timing constraint is calculated and the period jitter is calculated from the PSJR and the power supply/ground noise waveform, and performs a delay time calculation and the timing verification based on the period jitter.

The period jitter greatly varies depending on a relationship of an operation cycle of the logical cycle and power supply noise cycle. Performing the timing verification using the period jitter enables to consider only jitter component necessary for an actual verification. This further enables to verify with more accurate values than in a conventional timing verification considering the timing jitter, thereby improving verification accuracy. Therefore, by designing a circuit using a result of the timing verification facilitates to speed up the logical circuit.

In the timing analysis system of this embodiment, most of the delay information generation unit and the timing analysis unit can be used without changing from a conventional system. Accordingly the present invention enables to design and build a system efficiently.

Second Embodiment

A timing analysis system according to a second embodiment of the present invention is described hereinafter in detail. The timing analysis system of this embodiment is a configuration using a SDF (Standard Delay Format) file as delay information, and calculates the period jitter by the PSJR as with the first embodiment and performs a timing verification based on the period jitter.

Figure 15:
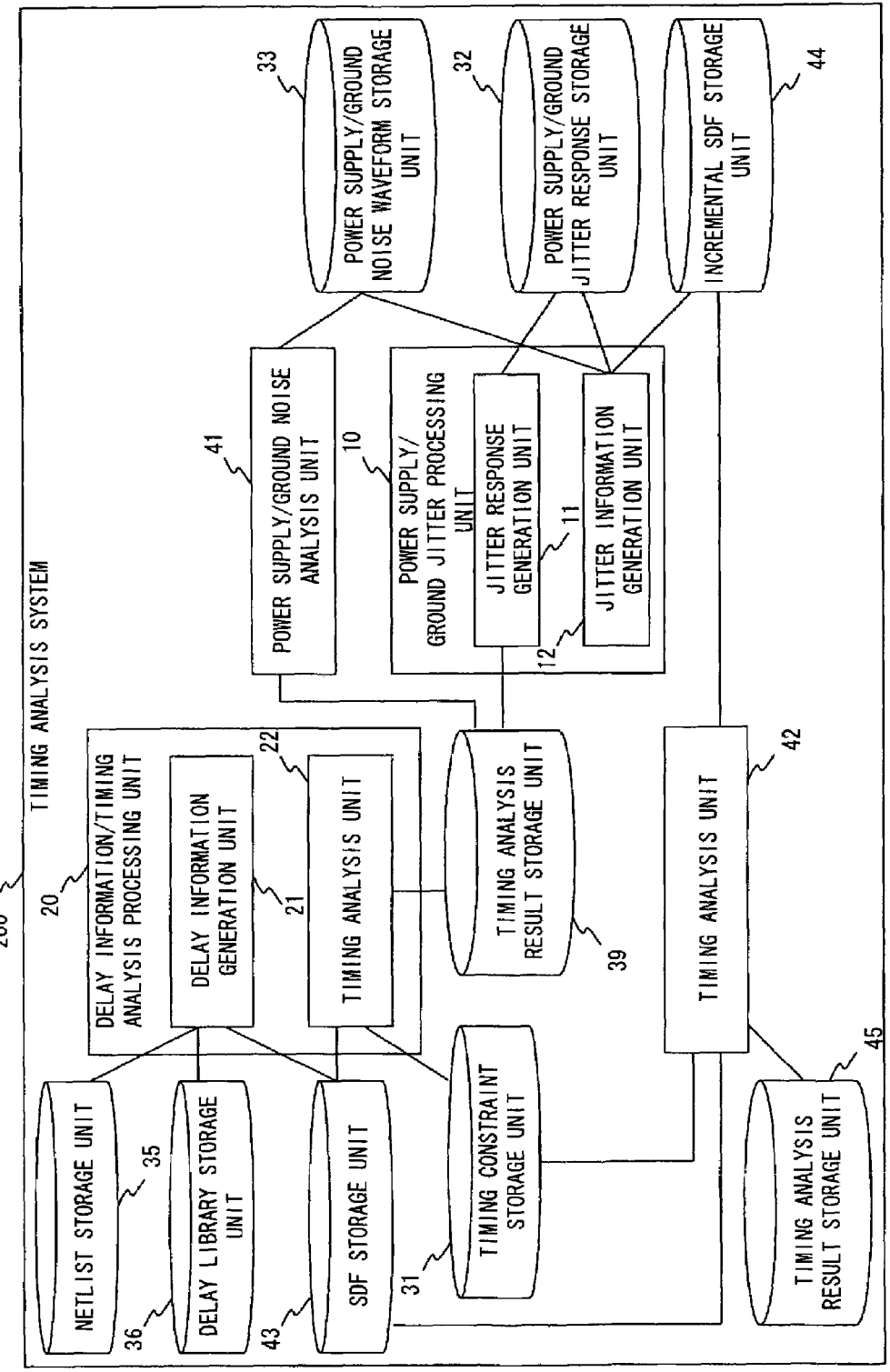
FIG. 15 is a configuration diagram of the timing analysis system according to the present invention.

FIG. 15 is a configuration of the timing analysis system of this embodiment. In FIG. 15, components identical to those in FIG. 1 are denoted by reference numerals identical to those therein.

As shown in FIG. 15, a timing analysis system 200 includes a power supply/ground jitter processing unit 10, a delay information and timing analysis processing unit 20. The timing analysis system 200 further includes a power supply/ground noise analysis unit 41 and a timing analysis unit 42. The power supply/ground noise analysis unit 41 generates a power supply/ground noise waveform. The timing analysis unit 42 performs the timing analysis from the SDF file.

As storage units for storing respective information, the timing analysis system 200 includes a timing constraint storage unit 31, a PSJR storage unit 32, a power supply/ground noise waveform storage unit 33, a netlist storage unit 35, a delay library storage unit 36, and a timing analysis result storage unit 39. The timing analysis system 200 further includes a SDF storage unit 43, an incremental SDF storage unit 44 for storing an incremental SDF file, and a timing analysis result storage unit 45 for storing a timing analysis result.

Figure 16:
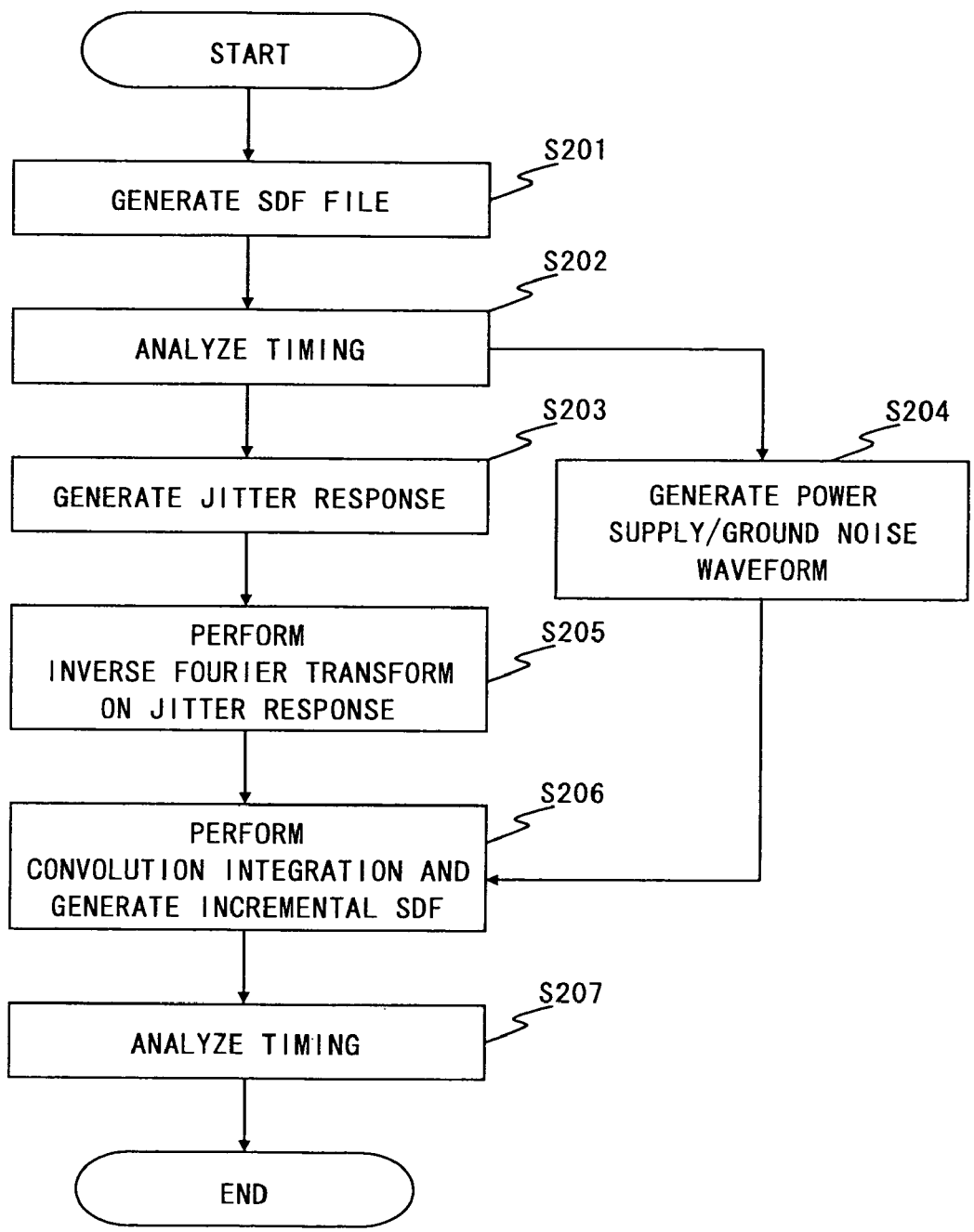
FIG. 16 is a flowchart of the timing analysis method according to the present invention.

FIG. 16 is a timing analysis method by the timing analysis system of FIG. 15.

Firstly the delay information generation unit 21 refers to the netlist in the netlist storage unit 35 and the delay library in the delay library storage unit 36, and generates the SDF file as the delay information (S201). The delay information generation unit 21 stores the generated SDF file to the SDF storage unit 43.

Then the timing analysis unit 22 refers to the SDF file in the SDF storage unit 43 and the timing constraint in the timing constraint storage unit 31, and performs the timing analysis (S202). The timing analysis unit 22 stores a result of the timing analysis to the timing analysis result storage unit 39.

Then the jitter response generation unit 11 refers to the timing analysis result in the timing analysis result storage unit 39, refers the clock cycle and clock latency information included in the timing analysis result, generates the PSJR (S203). The jitter response generation unit 11 stores the generated PSJR to the PSJR storage unit 32.

Then the jitter information generation unit 12 refers to the PSJR in the PSJR storage unit 32, and performs an inverse Fourier transformation (S205).

On the other hand after S202, the power supply/ground noise analysis unit 41 refers to the timing analysis result in the timing analysis result storage unit 39, and generates the power supply/ground noise waveform (S204). The power supply/ground noise analysis unit 41 stores the generated power supply/ground noise waveform to the power supply/ground noise waveform storage unit 33.

After S205 and S204, the jitter information generation unit 12 performs convolution integration against the power supply/ground noise waveform in the power supply/ground noise waveform storage unit 33 and a result of the inverse Fourier transform of S205, and generates the incremental SDF file (S206). The jitter information generation unit 12 stores the generated incremental SDF file to the incremental SDF storage unit 44.

At this time the jitter information generation unit 12 describes second terms of right-hand side of the equations 9 to 12 according to a grammar of the incremental SDF to generate the incremental SDF file. That is, the incremental SDF file includes delay time in each cell and fluctuation of line delay time. In this embodiment, the PSJR also includes the delay time in each cell and the fluctuation of line delay time.

Then the timing analysis unit 42 refers to the timing constraint in the timing constraint storage unit 31, the SDF file in the SDF storage unit 43, and the incremental SDF fie in the incremental SDF storage unit 44. And then the timing analysis unit 42 performs the timing analysis (S207). The timing analysis 42 stores a result of the timing analysis in the timing analysis result storage unit 45.

As described in the foregoing, in the timing analysis system using the SDF file as with the first embodiment, an accuracy of the timing verification can be improved and also the logical circuit can be speed up by performing the timing verification based on the period jitter.

Third Embodiment

A timing driven layout system according to a third embodiment of the present invention is described hereinafter in detail. The timing driven layout system of this embodiment as with the first embodiment calculates the period jitter from the PSJR, performs the timing verification based on the period jitter, and arranges and wires the circuit based on the verification result.

Figure 17:
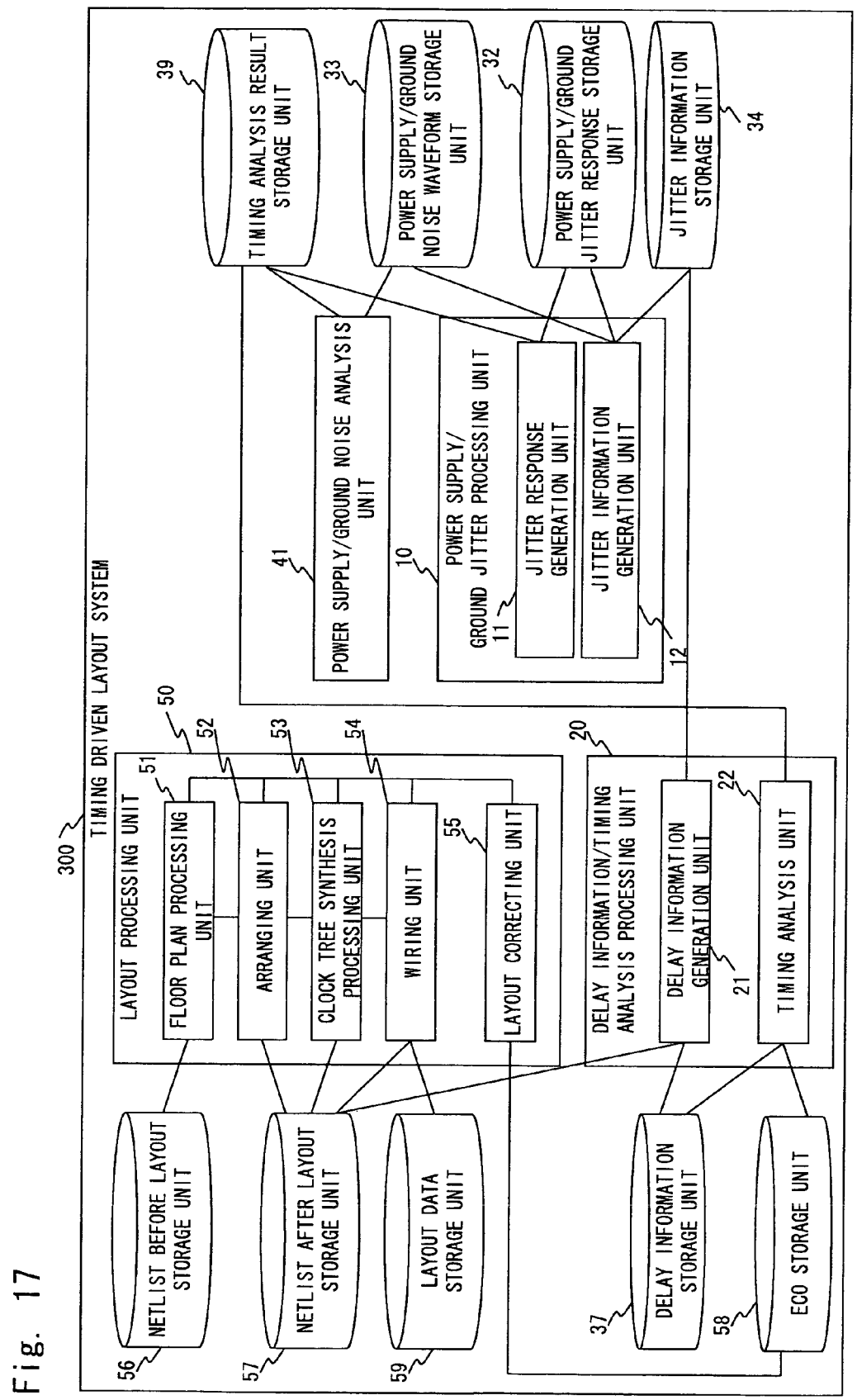
FIG. 17 is a configuration diagram of a timing driven layout system according to the present invention.

FIG. 17 is a configuration of the timing driven layout system (automatic layout system) of this embodiment. In FIG. 17, components identical to those in FIGS. 1 and 15 are denoted by reference numerals identical to those therein with description omitted.

As shown in FIG. 17, the timing driven layout system 300 includes a power supply/ground jitter processing unit 10, a delay information and timing analysis processing unit 20, a power supply ground noise analysis unit 41. The timing driven layout system 300 further includes a layout processing unit 50 for arranging and wiring circuits.

As storage units for storing each information, the timing driven layout system 300 includes a PSJR storage unit 32, a Power Supply/ground noise waveform storage unit 33, a jitter information storage unit 34, a delay information storage unit 37, and a timing analysis result storage unit 39. The timing driven layout system 300 further includes a netlist before layout storage unit 56 for storing a netlist before layout, a netlist after layout storage unit 57 for storing a netlist after layout, an ECO storage unit 58 for storing ECO (Engineering Change Order) information, and a layout data storage unit 59 for storing final layout data.

The layout processing unit 50 includes a floor plan processing unit 51 for determining a floor plan, an arranging unit 52 for arranging cells, a clock tree synthesis processing unit 53 for synthesizing a clock tree, a wiring unit 54 for wiring cells, and a layout correcting unit 55 for correcting layout.

Figure 18:
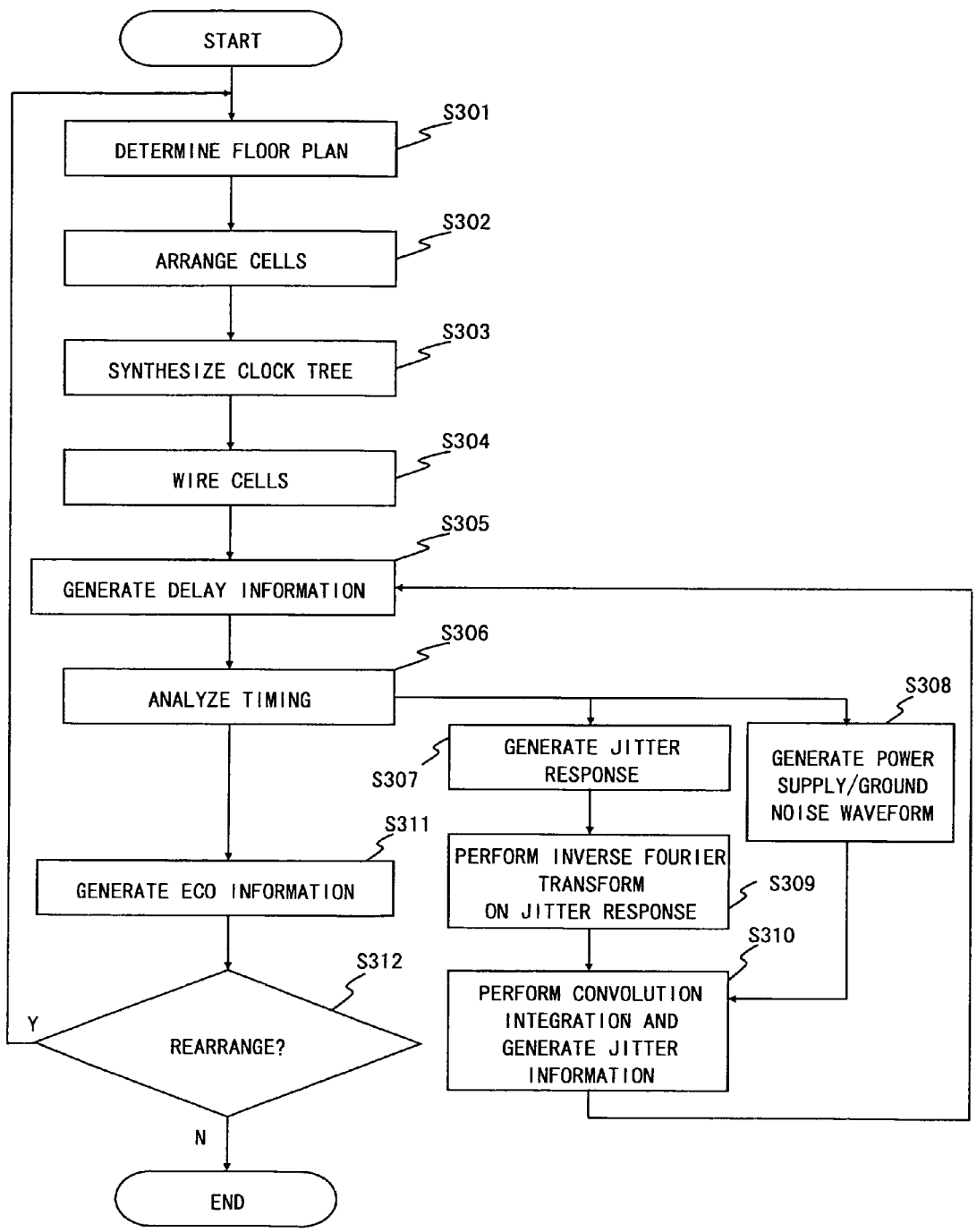
FIG. 18 is a flowchart of a timing driven layout method according to the present invention.

FIG. 18 is a timing driven layout method (automatic layout method) by the timing driven layout system 300 of FIG. 17. In this method, calculation of the delay information and timing analysis are repeated, and the ECO information is supplied back to each arranging and wiring process.

The floor plan processing unit 51 refers to the netlist before layout in the netlist before layout storage unit 56, and determines the floor plan (S301). The floor plan processing unit 51 outputs the determined floor plan to the arranging unit 52.

Then the arranging unit 52 arranges cells according to the determined floor plan (S302). The arranging unit 52 stores the netlist after layout of the cells to the netlist after layout storage unit 57.

Then clock tree synthesis processing unit 52 refers to the netlist after layout in the netlist after layout storage unit 57, and synthesizes a clock tree (S303). The clock tree synthesis processing unit 53 stores the netlist including the synthesized clock tree to the netlist after layout storage unit 57.

Then the wiring unit 54 refers to the netlist which is gained after synthesizing the clock tree in the netlist after layout storage unit 57, and wires the cells (S304). The wiring unit 54 stores the netlist after layout to the netlist after layout storage unit 57.

Then the delay information generation unit 21 refers to the netlist which is gained after the layout and wiring in the netlist after layout storage unit 57, and refers to the jitter information to be generated in S310, and generates the delay information (S305). The delay information generation unit 21 stores the generated information to the delay information storage unit 37.

Then the timing analysis unit 22 refers to the delay information in the delay information storage unit 37, and performs the timing analysis (S306). The timing analysis unit 22 stores a result of the timing analysis to the timing analysis result storage unit 39.

Then the jitter response generation unit 11 refers to the timing analysis result in the timing analysis result storage unit 39, and generates the PSJR (S307). The jitter response generation unit 11 stores the generated PSJR to the PSJR storage unit 32.

Then the jitter information generation unit 12 refers to the PSJR in the PSJR storage unit 32, and performs an inverse Fourier transformation (S309).

After S306, the power supply/ground noise analysis unit 41 refers to the timing analysis result in the timing analysis result storage unit 39, and generates the power supply/ground noise waveform (S308). The power supply/ground noise analysis unit 41 stores the generated power supply/ground noise waveform to the power supply/ground noise waveform storage unit 33.

After the S309 and S308, the jitter information generation unit 12 performs convolution integration against the power supply/ground noise waveform in the power supply/ground noise waveform storage unit 33 and the result of the inverse Fourier transform of S309, and generates the jitter information (S310). The jitter information generation unit 12 stores the generated jitter information to the jitter information storage unit 34. The jitter information is supplied back to S305 to be used for generating the delay information.

On the other hand after S306, the timing analysis unit 22 generates the ECO information based on the timing analysis result (S311). The timing analysis unit 22 stores the generated ECO information to the ECO storage unit 58.

Then the layout correcting unit 55 refers to the ECO information in the ECO storage unit 38, and determines whether to arrange again or not (S312). When determined to rearrange, information necessary for rearranging is output to the floor plan processing unit 51, the arranging unit 52, the clock tree synthesis processing unit 53, and the wiring unit 54, so as to arrange and wire again from S301. When determined not to rearrange, the wiring unit 54 stores the layout data to the layout data storage unit 59.

As described in the foregoing, in the timing driven layout system as with the first embodiment, by performing the timing verification based on the period jitter, an accuracy of the timing verification can be improved, and also an arrangement and wiring for speeding up the logical circuit is realized.

Fourth Embodiment

A co-design system according to a fourth embodiment of the present invention is described hereinafter in detail. The co-design system of this embodiment, as with the first embodiment, calculates the period jitter by the PSJR and performs a co-design based on the period jitter.

Figure 19:
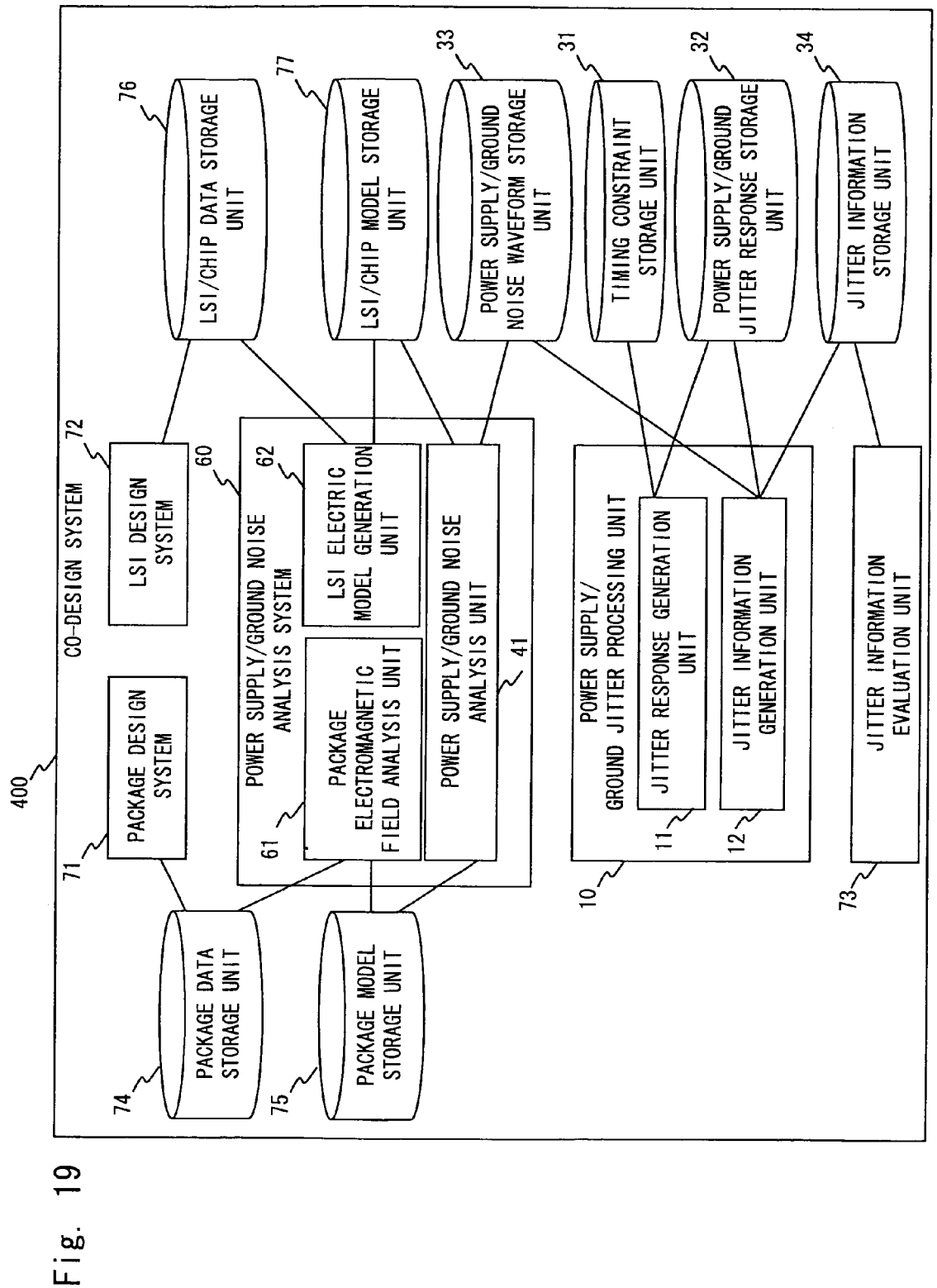
FIG. 19 is a configuration diagram of a co-design system according to the present invention.

FIG. 19 is a configuration of the co-design system of this embodiment. In FIG. 19, components identical to those in FIGS. 1 and 15 are denoted by reference numerals identical to those therein with detailed description omitted.

A co-design system 400 is a system for co-designing a LSI and a package (interposer). Essentially the power supply/ground noise should be analyzed by modeling a large-scale system including the package and PCB board. Conventionally the analysis has not been very common, because performance of information processing unit required for the analysis were low and need for the analysis were also low. However in recent years, the need for the analysis is rapidly increasing along with speed up of operating frequency of the LSI. The co-design system 400 considers the power supply/ground noise by the package to perform the timing analysis.

As shown in FIG. 19, the co-design system 400 includes a power supply/ground jitter processing unit 10. The co-design system 400 further includes a package design system 71 for designing a package, a LSI design system 72 for designing LSI and chip, a power supply/ground noise analysis system 60 for analyzing the power supply/ground noise of the package and the LSI, and a jitter information evaluation unit 73 for evaluating jitter information.

As storage units for storing respective information, the co-design system 400 includes a timing constraint storage unit 31, a PSJR storage unit 32, a Power Supply/ground noise waveform storage unit 33, and a jitter information storage unit 34. The co-design system 400 further includes a package data storage unit 74 for storing package data, a package model storage unit 75 for storing a package model, a LSI/chip data storage unit 76 for storing LSI/chip data, and a LSI/chip model storage unit 77 for storing LSI/chip model.

The power supply/ground noise analysis system 60 includes a package electromagnetic field analysis unit (electromagnetic field simulator) 61 for generating the package model, a LSI electric model generation unit 62 for generating the LSI/chip model, and a power supply/ground noise analysis unit 41 for analyzing the power supply/ground noise.

Figure 20:
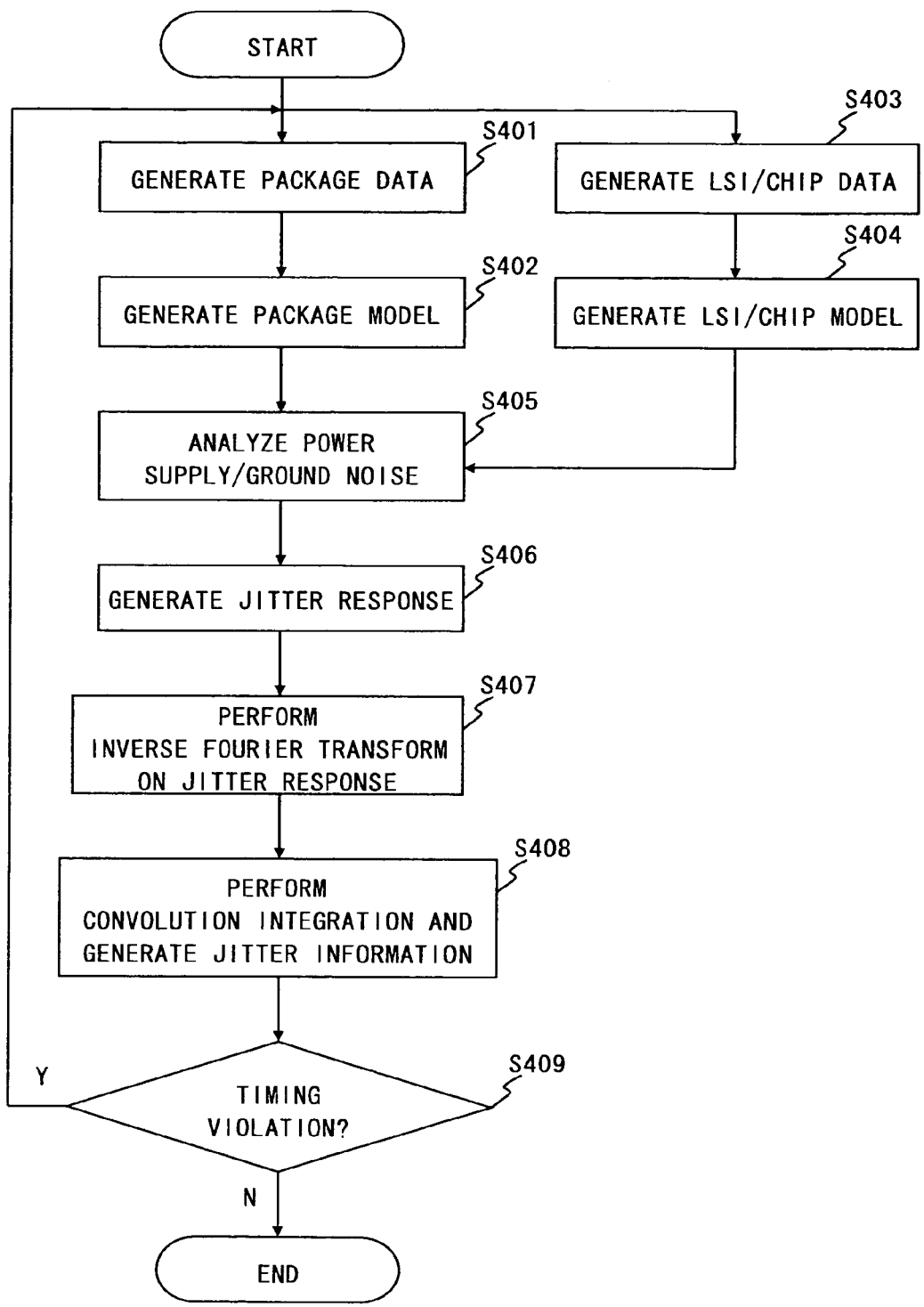
FIG. 20 is flowchart of a co-design method according to the present invention.

FIG. 20 is a co-design method by the co-design system 400 of FIG. 19.

The package design system 71 generates the package data and stores the package data to the package data storage unit 74 (S401). The LSI design system 72 generates the LSI/chip data and stores the LSI/chip data to the LSI chip data storage unit 76 (S403).

Subsequent to S401, the package electromagnetic field analysis unit 61 refers to the package data in the package data storage unit 74, generates the package model, and stores the package model to the package model storage unit 75 (S402). There are two formats of the interposer model, which are S parameter and Spice netlist formats. The package electromagnetic field analysis unit 61 outputs the package model in accordance with the format of the package model.

After S403, the LSI electric model generation unit 62 refers to the LSI/chip data in the LSI/chip data storage unit 76, generates the LSI/chip model, and stores the LSI/chip model to the LSI/chip model storage unit 77 (S404).

Subsequent to S402 and S404, the power supply/ground noise analysis unit 41 refers to the package model in the package model storage unit 75 and the LSI/chip model in the LSI/chip model storage unit 77, and analyzes the power supply/ground noise to generate the power supply/ground noise waveform (S405). The power supply/ground noise analysis unit 41 stores the generated power supply/ground noise waveform to the power supply/ground noise waveform storage unit 33.

Then the jitter response generation unit 11 refers to the timing constraint in the timing constraint storage unit 31, and generates the PSJR (S406). The jitter response generation unit 11 stores the generated PSJR to the PSJR storage unit 32.

Then the jitter information generation unit 12 refers to the PSJR in the PSJR storage unit 32, and performs an inverse Fourier transform (S407).

Then the jitter information generation unit 12 performs convolution integration against the power supply/ground noise waveform in the power supply/ground noise waveform storage unit 33 and the result of the inverse Fourier transform of S407, generates the incremental SDF file (S408). The jitter information generation unit 12 stores the generated jitter information to the jitter information storage unit 34.

Then the jitter information evaluation unit 73 refers to the jitter information in the jitter information storage unit 34, and evaluates whether a period jitter value induces a timing violation (S409). The jitter information evaluation unit 73 refers to the period jitter value and compares the period jitter value with a timing margin value, which is previously defined in a design specification. If the period jitter value is more than or equal to the timing margin value, it is evaluated as a timing violation. In such case the package and LSI designs are repeated from S401 and S403. If the period jitter value is less than or equal to the timing margin value, it is evaluated as to have no timing violation. The co-design is finished in such case.

As described in the foregoing, in the co-design system of the LSI and package, an accuracy of the timing verification can be improved and also the co-design of the package and LSI for speeding up the logical circuit can be performed as with the first embodiment.

Other Embodiment

The timing analysis systems 100 and 200, the timing driven layout system 300, and the co-design system 400 are realized by computer including a personal computer or a server computer, for example.

FIG. 21 is an example of a hardware configuration to realize such system. For example the system includes a CPU (Central Processing Unit) 501 and a memory 502. The CPU 501 and the memory 502 are connected to a HDD (Hard Disk Drive) 503, an auxiliary memory unit, via a bus. The system typically includes user interface hardware. As the user interface hardware for example, the system includes a pointing device (e.g. mouse, joy stick) for input, an input unit 504 such as a keyboard, a display unit 505 such as a liquid crystal display for showing visual data to a user. A storage medium such as the HDD 503 may store a computer program in cooperation with an operating system for giving commands to the CPU 501 etc and executing functions of the system. That is, by each block of the systems in FIGS. 1, 15, 17, and 19 being configured by the program deployed in the memory 502, and cooperating with other hardware configuration, each block of the systems of FIGS. 1, 15, 17, and 19 are configured. Methods in FIGS. 2, 16, 18, and 20 are realized by certain programs executed in the CPU 501. Systems of above-mentioned may be configured by a plurality of computers instead of a single computer.

It is apparent that the present invention is not limited to the above embodiment and it may be modified and changed without departing from the scope and spirit of the invention.

What is claimed is:

1. A timing analysis apparatus of an integrated logical circuit, comprising:
a jitter information generation unit generating period jitter information, which is jitter information between adjacent clock edges in an operational clock, in response to power supply/ground noise waveform information;
a jitter information storage unit storing the period jitter information generated in the jitter information generation unit; and
a timing analysis unit performing a timing analysis of the integrated logical circuit based on the period jitter information stored in the jitter information storage unit.

2. The timing analysis apparatus according to claim 1, further comprising:
a jitter response information generation unit retrieving timing constraint information and generating jitter response information responding to power supply/ground noise based on the retrieved timing constraint information; and
a jitter response information storage unit storing the jitter response information generated by the jitter response information generation unit,
wherein the jitter information generation unit retrieves the power supply/ground noise waveform information and the stored jitter response information, and generates the period jitter information based on the retrieved power supply/ground noise waveform information and the jitter response information.

3. The timing analysis apparatus according to claim 2, wherein the timing constraint information is a clock latency and a clock cycle of an operational clock.

4. The timing analysis apparatus according to claim 2, wherein the jitter response information is a frequency response of a period jitter against the power supply/ground noise waveform information.

5. The timing analysis apparatus according to claim 2, wherein the jitter generation unit comprises:
an inverse Fourier transform unit performing an inverse Fourier transform against the jitter response information; and
a convolution integration unit performing a convolution integration against a result of the inverse Fourier transform and the power supply/ground noise waveform information and generating the period jitter.

6. The timing analysis apparatus according to claim 2, wherein the jitter information generation unit comprises:
a Fourier transform unit performing a Fourier transform against the power supply/ground noise waveform information;
a convolution integration unit performing a convolution integration against the jitter response information and a result of the Fourier transform; and
an inverse Fourier transform unit performing an inverse Fourier transform against a result of the convolution integration, and generating the period jitter information.

7. The timing analysis apparatus according to claim 1, further comprising:
a delay information generation unit retrieving netlist information and delay library information and the stored period jitter information of the integrated logical circuit, correcting delay time in cell and line delay time based on the netlist information and the delay library information by the period jitter information, and generating delay information; and
a delay information storage unit storing the generated delay information,
wherein the timing analysis unit retrieves the stored delay information and performs the timing analysis based on the delay information.

8. The timing analysis apparatus according to claim 1, wherein the timing analysis unit performs the timing analysis with a sum of a maximum value of the delay time in cell and a maximum value of the line delay time or a sum of a minimum value of the delay time in cell and a minimum value of the line delay time as a delay time of a path.

9. A timing driven layout system which includes the timing analysis apparatus according to claim 1, the timing driven layout system further comprising:
a layout processing unit arranging and wiring a circuit based on a result of a timing verification performed by the timing analysis unit.

10. A timing analysis method for an integrated logical circuit being adapted to a timing analysis process by a computer, the method comprising:
generating period jitter information, which is jitter information between adjacent clock edges in an operational clock, in response to power supply/ground noise waveform information;
storing the generated period jitter information to a jitter information storage unit; and
performing a timing analysis against the integrated logical circuit based on the stored period jitter information.

* * * * *